US006962852B2

United States Patent
Ding

(10) Patent No.: US 6,962,852 B2
(45) Date of Patent: Nov. 8, 2005

(54) NONVOLATILE MEMORIES AND METHODS OF FABRICATION

(75) Inventor: Yi Ding, Sunnyvale, CA (US)

(73) Assignee: ProMOS Technologies Inc., Hsin-Chu (TW)

( * ) Notice: Subject to any disclaimer, the term of this patent is extended or adjusted under 35 U.S.C. 154(b) by 142 days.

(21) Appl. No.: 10/631,552

(22) Filed: Jul. 30, 2003

(65) Prior Publication Data

US 2004/0185616 A1 Sep. 23, 2004

Related U.S. Application Data

(63) Continuation of application No. 10/393,212, filed on Mar. 19, 2003.

(51) Int. Cl.[7] .............................................. H01L 21/336
(52) U.S. Cl. ........................ 438/267; 438/257; 438/266; 438/593; 438/596
(58) Field of Search ................................. 438/257–267, 438/588, 593, 596; 257/316

(56) References Cited

U.S. PATENT DOCUMENTS

| | | | |
|---|---|---|---|
| 5,402,371 A | | 3/1995 | Ono |
| 5,445,983 A | * | 8/1995 | Hong .......................... 438/258 |
| 5,668,757 A | | 9/1997 | Jeng |
| 5,705,415 A | | 1/1998 | Orlowski et al. |
| 5,856,943 A | | 1/1999 | Jeng |
| 5,901,084 A | | 5/1999 | Ohnakado |
| 5,912,843 A | | 6/1999 | Jeng |
| 6,040,216 A | * | 3/2000 | Sung .......................... 438/257 |
| 6,057,575 A | | 5/2000 | Jenq |
| 6,107,141 A | * | 8/2000 | Hsu et al. .................... 438/267 |
| 6,130,129 A | | 10/2000 | Chen |
| 6,133,098 A | * | 10/2000 | Ogura et al. ................. 438/267 |
| 6,134,144 A | | 10/2000 | Lin et al. |
| 6,162,682 A | | 12/2000 | Kleine |

(Continued)

FOREIGN PATENT DOCUMENTS

EP 0 938 098 A2 8/1999

OTHER PUBLICATIONS

Shirota, Riichiro "A Review of 256Mbit NAND Flash Memories and Flash Future Trend," Feb. 2000, Nonvolatile Memory Workshop in Monterey, California, pp. 22–31.

Naruke, K.; Yamada, S.; Obi, E.; Taguchi, S.; and Wada, M. "A New Flash–Erase EEPROM Cell with A Sidewall Select–Gate On Its Source Side," 1989 IEEE, pp. 604–606.

(Continued)

*Primary Examiner*—Tom Thomas
*Assistant Examiner*—N. Drew Richards
(74) *Attorney, Agent, or Firm*—Michael Shenker; MacPherson Kwol Chen & Heid LLP

(57) ABSTRACT

To fabricate a nonvolatile memory, a select gate (140) is formed over a semiconductor substrate. A dielectric (810, 1010, 1030) is formed over the select gate. A floating gate layer (160), e.g. doped polysilicon, is formed over the select gate. The floating gate layer is removed from over at least a portion of the select gate. A dielectric (1510), e.g., ONO, is formed over the floating gate layer, and a control gate layer (170) is formed over this dielectric. The control gate layer has an upward protrusion over the select gate. Then another layer (1710), e.g. silicon nitride, is formed on the control gate layer, but the protrusions of the control gate layer are exposed. The exposed portion of the control gate layer is etched selectively until the control gate layer is removed from over at least a portion of the select gate. Then another layer (1910) is formed on the exposed portion of the control gate layer. This is thermally grown silicon dioxide in some embodiments. Then the silicon nitride is removed. The control gate layer, the ONO, and the floating gate layer are etched selectively to the silicon dioxide to define the control and floating gates. Other embodiments are also provided.

7 Claims, 39 Drawing Sheets

U.S. PATENT DOCUMENTS

| | | | |
|---|---|---|---|
| 6,171,909 B1 | 1/2001 | Ding et al. | |
| 6,200,856 B1 | 3/2001 | Chen | |
| 6,214,669 B1 | 4/2001 | Hisamune | |
| 6,218,689 B1 | 4/2001 | Chang et al. | |
| 6,232,185 B1 | 5/2001 | Wang | |
| 6,261,903 B1 | 7/2001 | Chang et al. | |
| 6,265,739 B1 | 7/2001 | Yaegashi et al. | |
| 6,266,278 B1 | 7/2001 | Harari et al. | |
| 6,291,297 B1 * | 9/2001 | Chen | 438/265 |
| 6,326,661 B1 | 12/2001 | Dormans et al. | |
| 6,344,993 B1 | 2/2002 | Harari et al. | |
| 6,355,524 B1 | 3/2002 | Tuan et al. | |
| 6,365,457 B1 | 4/2002 | Choi | |
| 6,414,872 B1 | 7/2002 | Bergemont et al. | |
| 6,420,231 B1 | 7/2002 | Harari et al. | |
| 6,436,764 B1 | 8/2002 | Hsieh | |
| 6,437,360 B1 | 8/2002 | Cho et al. | |
| 6,438,036 B2 | 8/2002 | Seki et al. | |
| 6,468,865 B1 | 10/2002 | Yang et al. | |
| 6,486,023 B1 | 11/2002 | Nagata | |
| 6,518,618 B1 | 2/2003 | Fazio et al. | |
| 6,541,324 B1 | 4/2003 | Wang | |
| 6,541,829 B2 | 4/2003 | Nishinohara et al. | |
| 6,566,196 B1 * | 5/2003 | Haselden et al. | 438/257 |
| 6,635,533 B1 * | 10/2003 | Chang et al. | 438/259 |
| 6,642,103 B2 * | 11/2003 | Wils et al. | 438/257 |
| 6,696,340 B2 | 2/2004 | Furuhata | |
| 6,747,310 B2 | 6/2004 | Fan et al. | |
| 6,803,276 B2 * | 10/2004 | Kim et al. | 438/257 |
| 2002/0064071 A1 | 5/2002 | Takahashi et al. | |
| 2002/0197888 A1 | 12/2002 | Huang et al. | |
| 2003/0205776 A1 | 11/2003 | Yaegashi et al. | |
| 2003/0218908 A1 | 11/2003 | Park et al. | |
| 2004/0004863 A1 | 1/2004 | Wang | |

OTHER PUBLICATIONS

Wu, A.T.; Chan T.Y.; Ko, P.K.; and Hu, C. "A Novel High–Speed, 5–Volt Programming EPROM Structure With Source–Side Injection," 1986 IEEE, 584–587.

Mizutani, Yoshihisa; and Makita, Koji "A New EPROM Cell With A Sidewall Floating Gate Fro High–Density and High Performance Device," 1985 IEEE, 635–638.

Ma, Y.; Pang, C.S.; Pathak, J.; Tsao, S.C.; Chang, C.F.; Yamauchi, Y.; Yoshimi, M. "A Novel High Density Contactless Flash Memory Array Using Split–Gate Source–Side–Injection Cell for 5V–Only Applications," 1994 Symposium on VLSI Technology Digest of Technical Papers, pp. 49–50.

Mih, Rebecca et al. "0.18um Modular Triple Self–Aligned Embedded Split–Gate Flash Memory," 2000 Symposium on VLSI Technology Digest of Technical Papers, pp. 120–121.

Ma, Yale et al., "A Dual–Bit Split–Gate EEPROM (DSG) Cell in Contactless Array for Single Vcc High Density Flash Memories," 1994 IEEE, 3.5.1–3.5.4.

Spinelli, Alessandro S., "Quantum–Mechanical 2D Simulation of Surface–and Buried–Channel p–MOS,"2000 International Conference on Simulation of Semiconductor Processes and Devices: SISPAD 2000, Seattle, WA Sep. 6–8, 2000.

Kim, K.S. et al. "A Novel Dual String NOR (DuSnor) Memory Cell Technology Scalabe to the 256 Mbit and 1 Gbit Flash Memories," 1995 IEEE 11.1.1–11.1.4.

Bergemont, A. et al."NOR Virtual Ground (NVG)– A New Scaling Concept for Very High Density FLAS EEPROM and its Implementation in a 0.5 um Process," 1993 IEEE 2.2.1–2.2.4.

Van Duuren, Michiel et al., "Compact poly–CMP Embedded Flash Memory Cells For One or Two Bit Storage," Philips Research Leuven, Kapeldreef 75, B3001 Leuven, Belgium, pp. 73–74.

U.S. Appl. No. 10/440,466, entitled "Fabrication Of Conductive Gates For Nonvolatile Memories From Layers With Protruding Portions," filed May 16, 2003.

U.S. Appl. No. 10/440,005, entitled "Fabrication of Dielectric On A Gate Surface To Insulate The Gate From Another Element Of An Integrated Circuit," filed May 16, 2003.

U.S. Appl. No. 10/440,508, entitled "Fabrication Of Gate Dielectric In Nonvolatile Memories Having Select, Floating And Control Gates," filed May 16, 2003.

U.S. Appl. No. 10/440,500, entitled "Integrated Circuits With Openings that Allow Electrical Contact To Conductive Features Having Self–Aligned Edges," filed May 16, 2003.

U.S. Appl. No. 10/393,212, entitled "Nonvolatile Memories And Methods Of Fabrication," filed Mar. 19, 2003.

U.S. Appl. No. 10/411,813, entitled "Nonvolatile Memories With A Floating Gate Having An Upward Protrusion," filed Apr. 10, 2003.

U.S. Appl. No. 10/393,202, entitled "Fabrication of Integrated Circuit Elements In Structures With Protruding Features," filed Mar. 19, 2003.

U.S. Appl. No. 10/631,941, entitled "Nonvolatile Memory Cell With Multiple Floating Gates Formed After The Select Gate," filed Jul. 30, 2003.

U.S. Appl. No. 10/632,155, entitled "Nonvolatile Memory Cells With Buried Channel Transistors," filed Jul. 30, 2003.

U.S. Appl. No. 10/632,007, entitled "Arrays Of Nonvolatile Memory Cells Wherin Each Cell Has Two Conductive Floating Gates," filed Jul. 30, 2003.

U.S. Appl. No. 10/631,452, entitled "Fabrication Of Dielectric For A Nonvolatile Memory Cell Having Multiple Floating Gates," filed Jul. 30, 2003.

U.S. Appl. No. 10/632,154, entitled "Fabrication Of Gate Dielectric In Nonvolatile Memories In Which A Memory Cell Has Multiple Floating Gates," filed Jul. 30, 2003.

U.S. Appl. No. 10/632,186, entitled "Nonvolatile Memory Cell With Multiple Floating Gates Formed After The Select Gate And Having Upward Protrusions," filed Jul. 30, 2003.

U.S. Appl. No. 10/798,475, entitled "Fabrication of Conductive Lines Interconnecting Conductive Gates in Non-volatile Memories and Non–Volatile Memory Structures," filed Mar. 10, 2004.

U.S. Appl. No. 10/797,972, entitled "Fabrication of Conductive Lines Interconnecting First Conductive Gates in Nonvolatile Memories Having Second Conductive Gates Provided By Conductive Gates Lines, Wherein The Adjacent Conductive Gate Lines For The Adjacent Columns Are Spaced From Each Other, And Non–Volatile Memory Structures," filed Mar. 10, 2004.

* cited by examiner

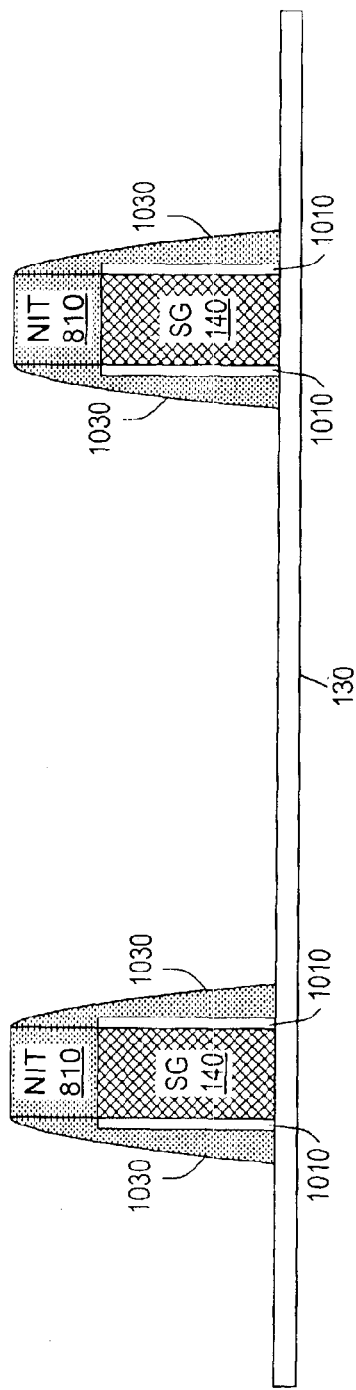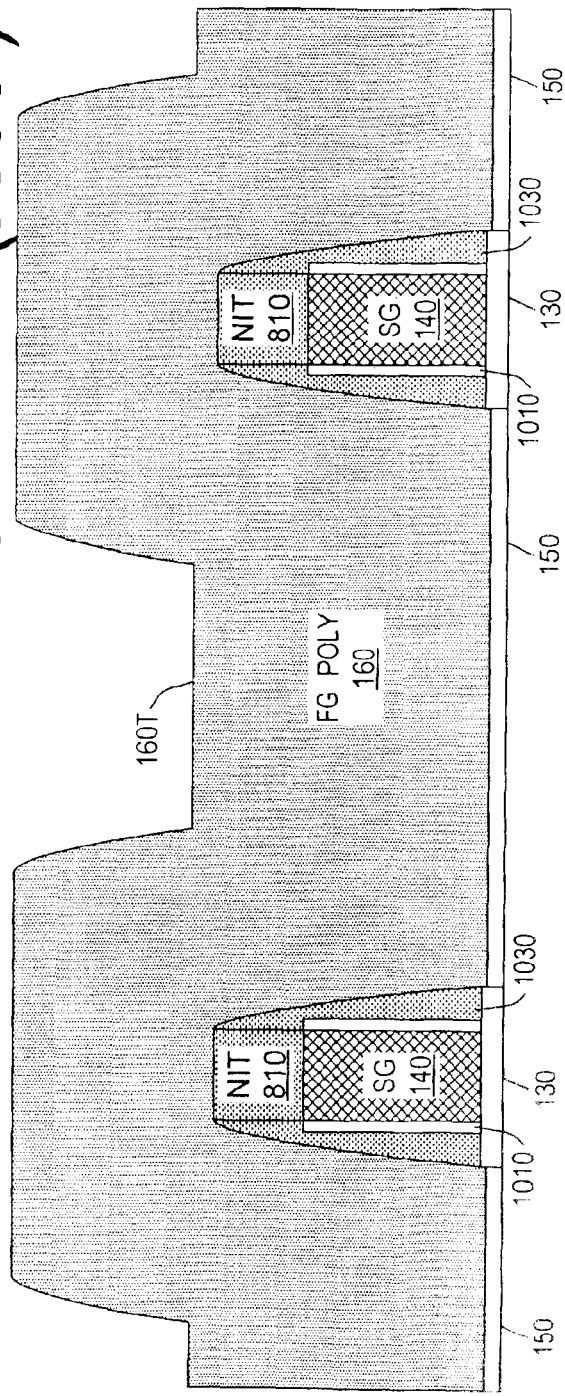

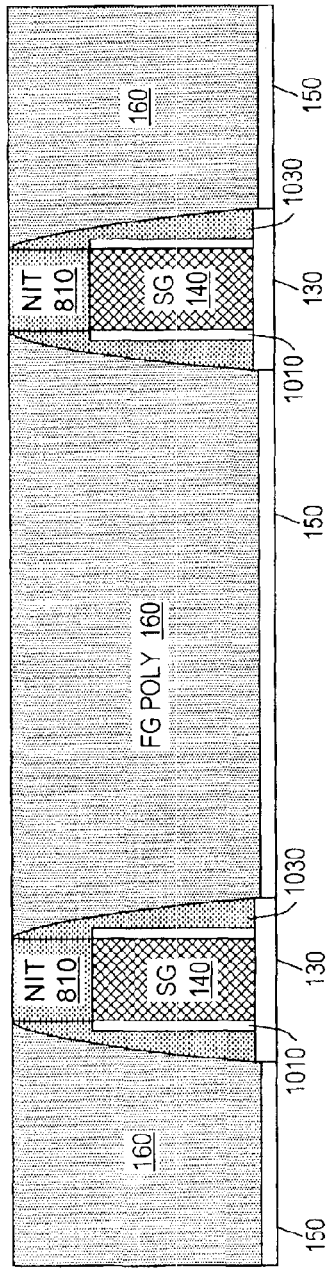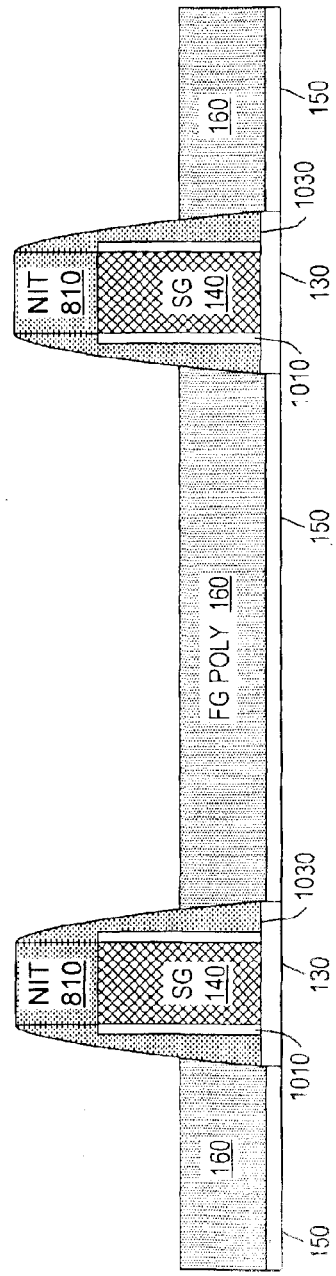

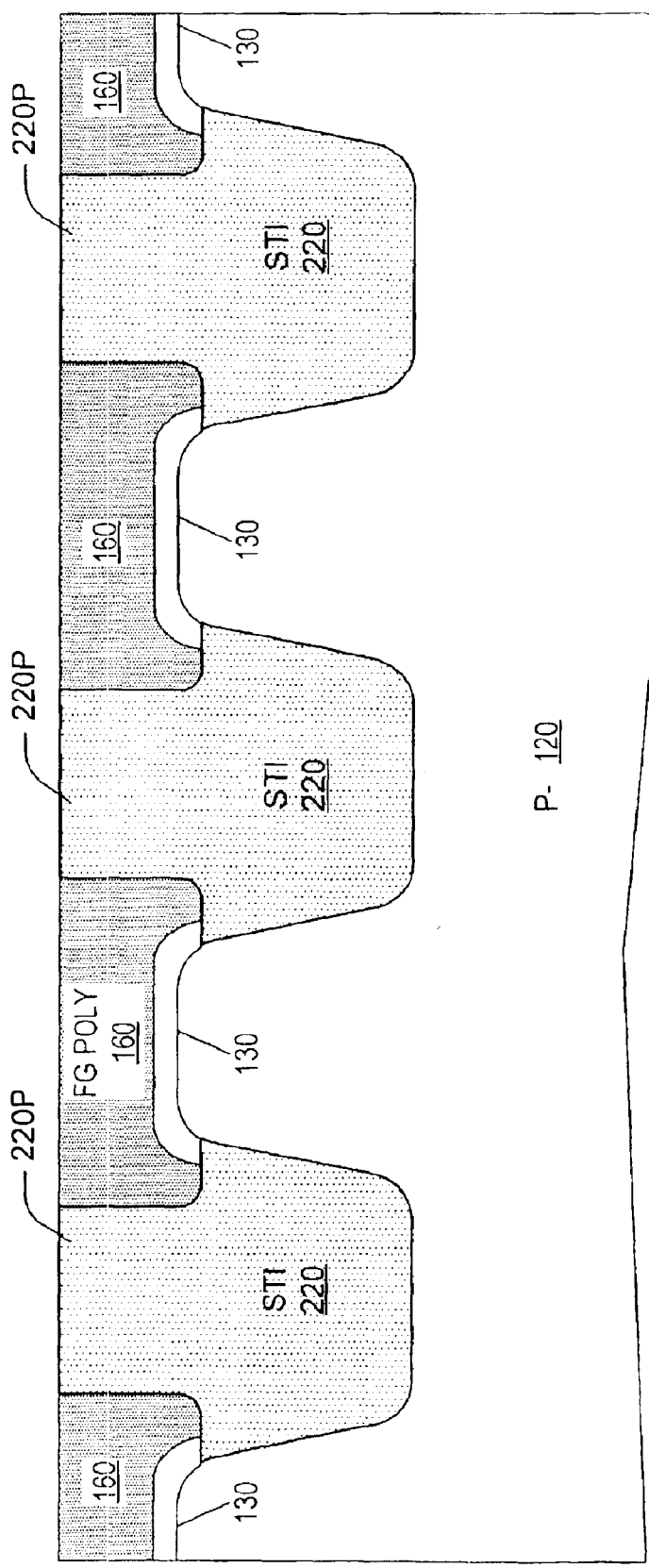
FIG. 13B (Y2-Y2')

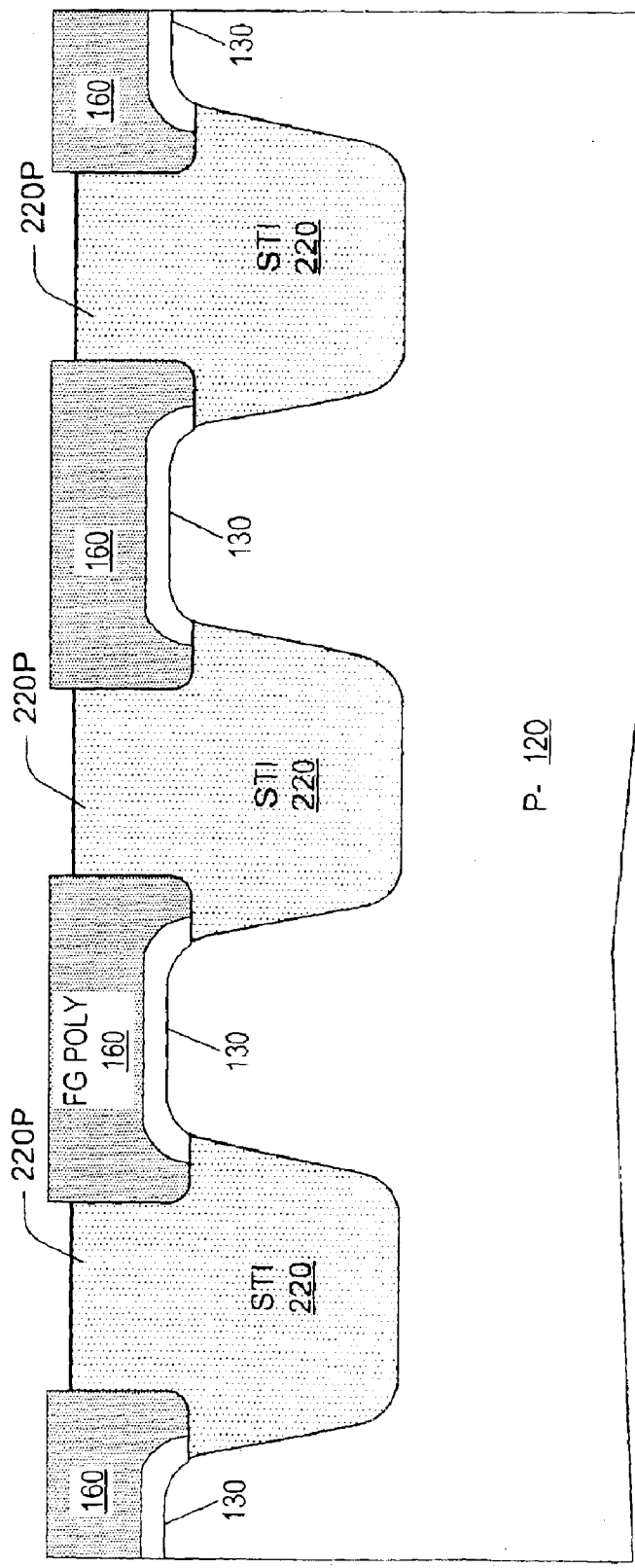
FIG. 14 (Y2-Y2')

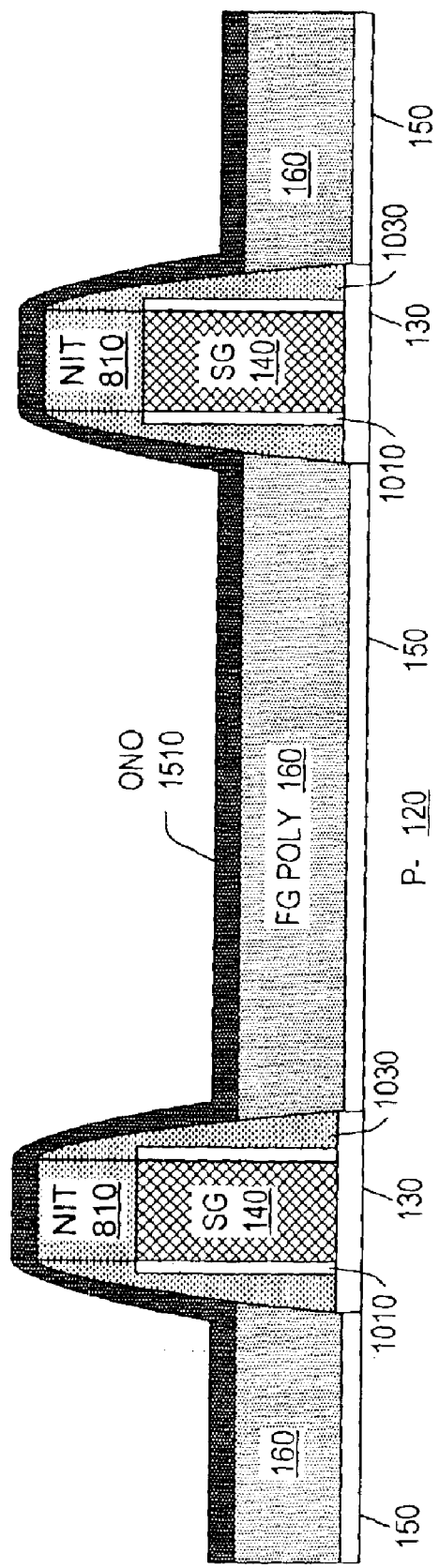
FIG. 15A (X-X')

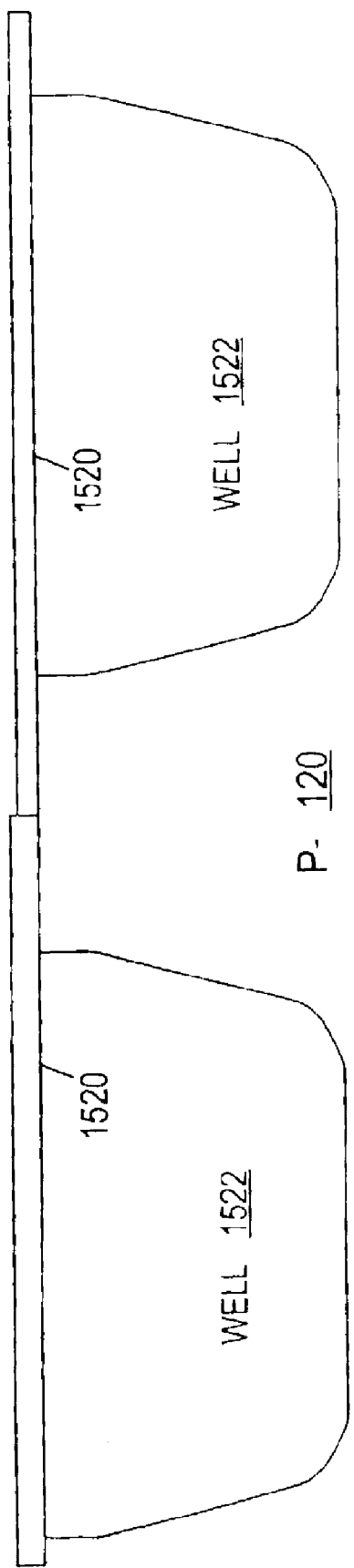

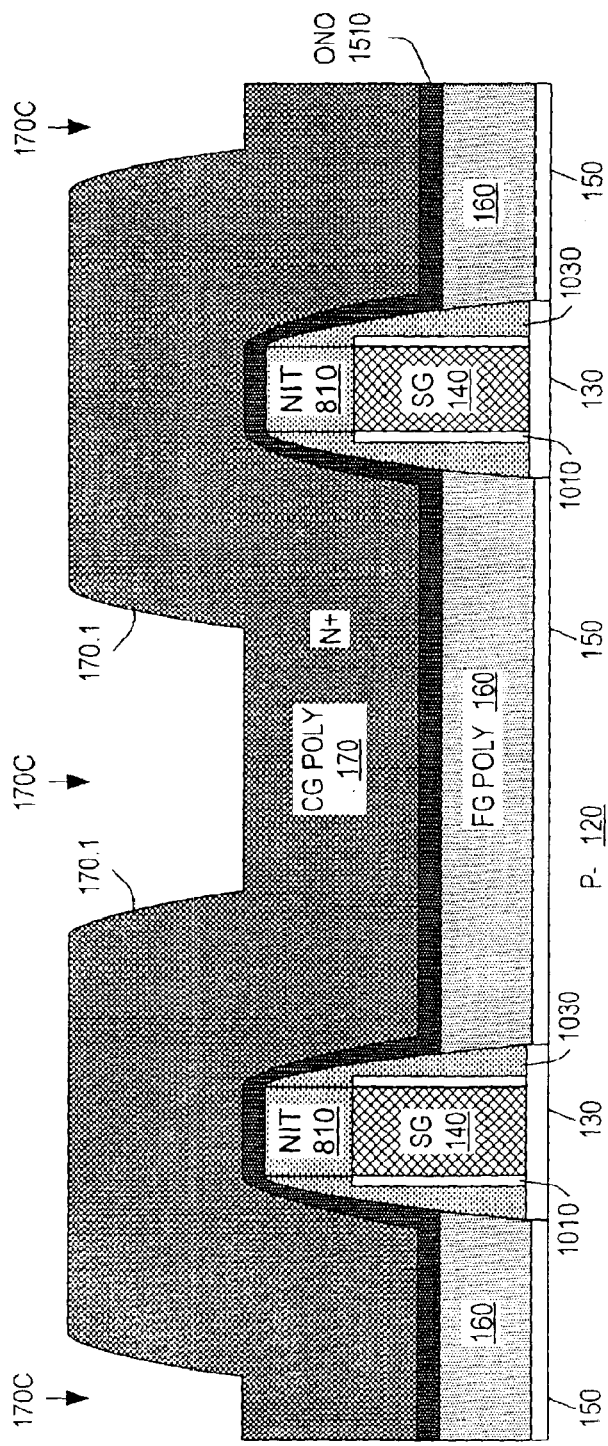
FIG. 16A (X-X')
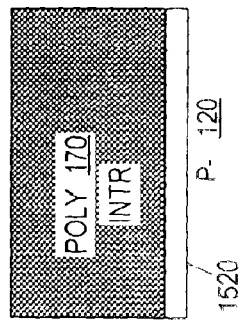
FIG. 16B

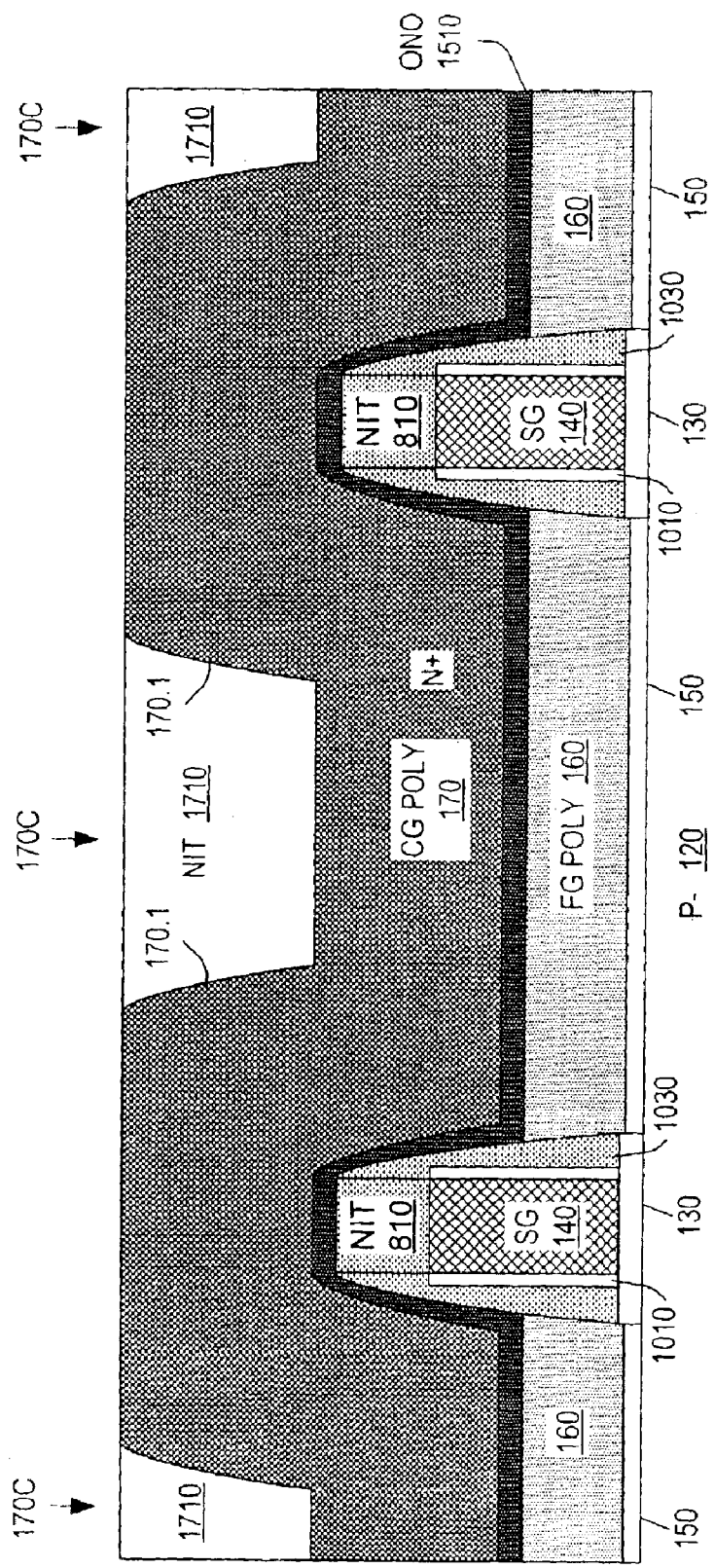
FIG. 17A (X-X')

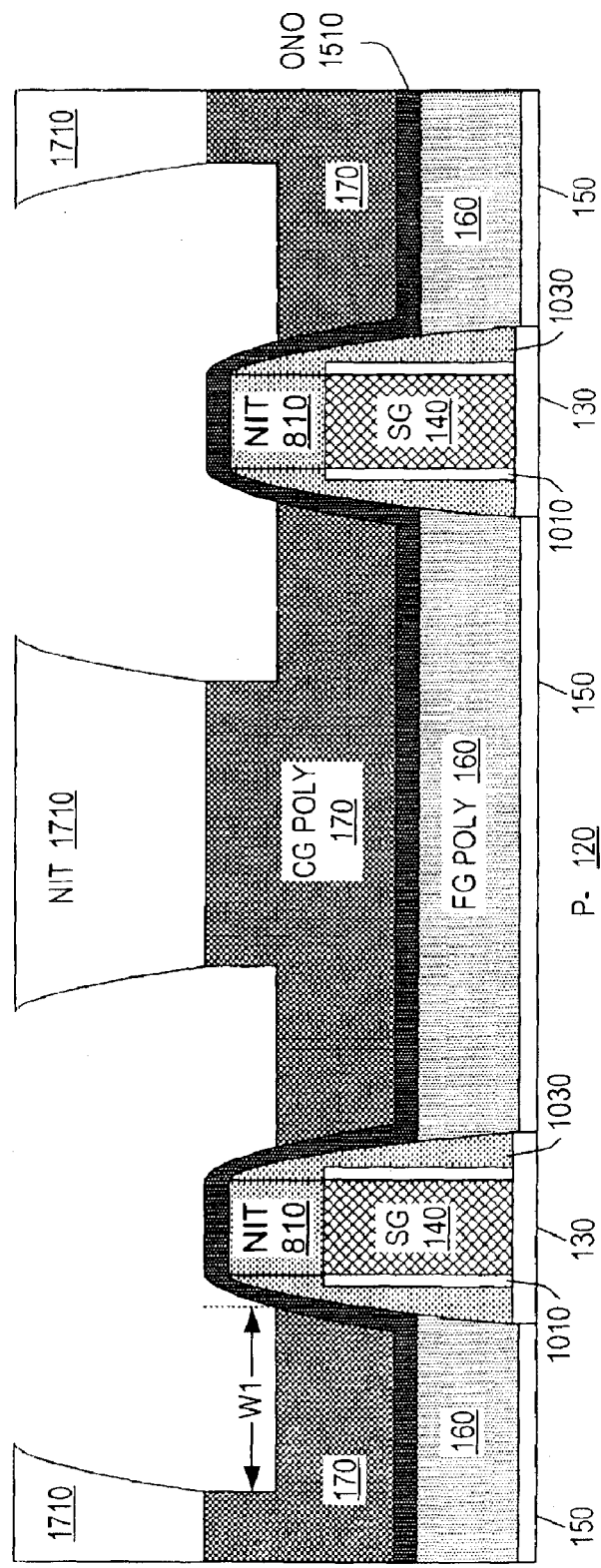
FIG. 18 (X-X')

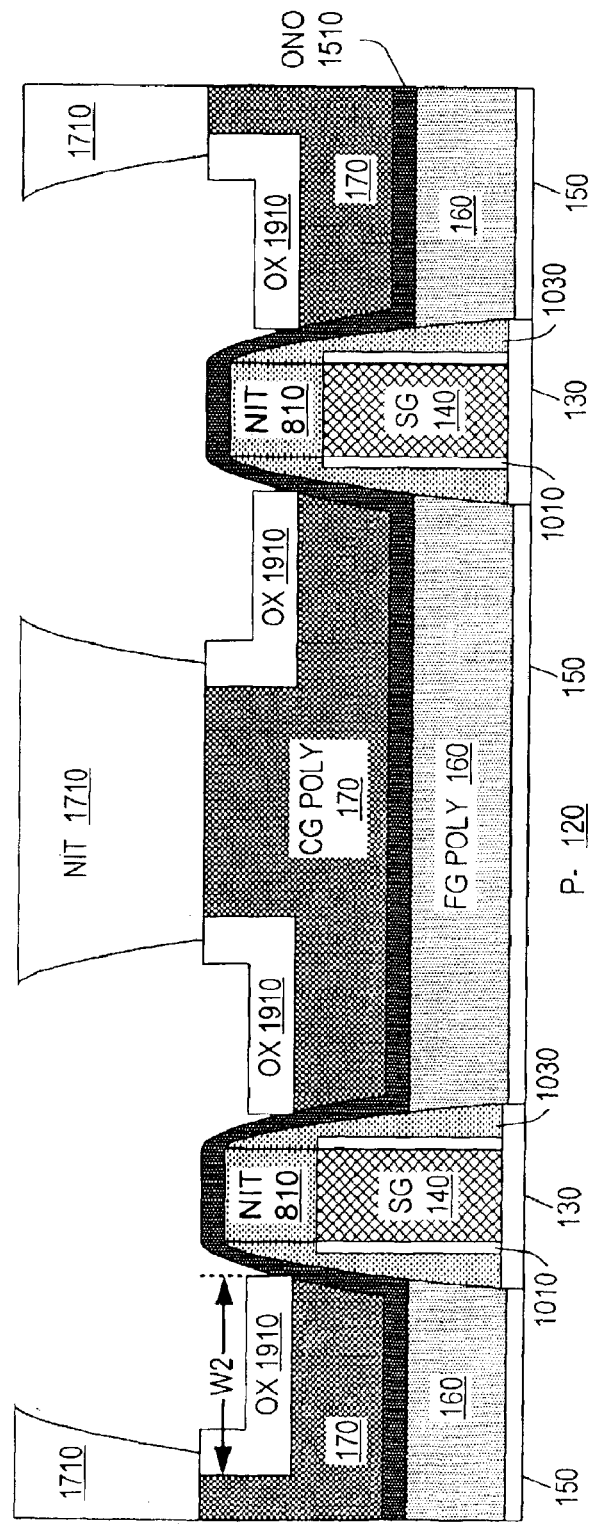
FIG. 19 (X-X')

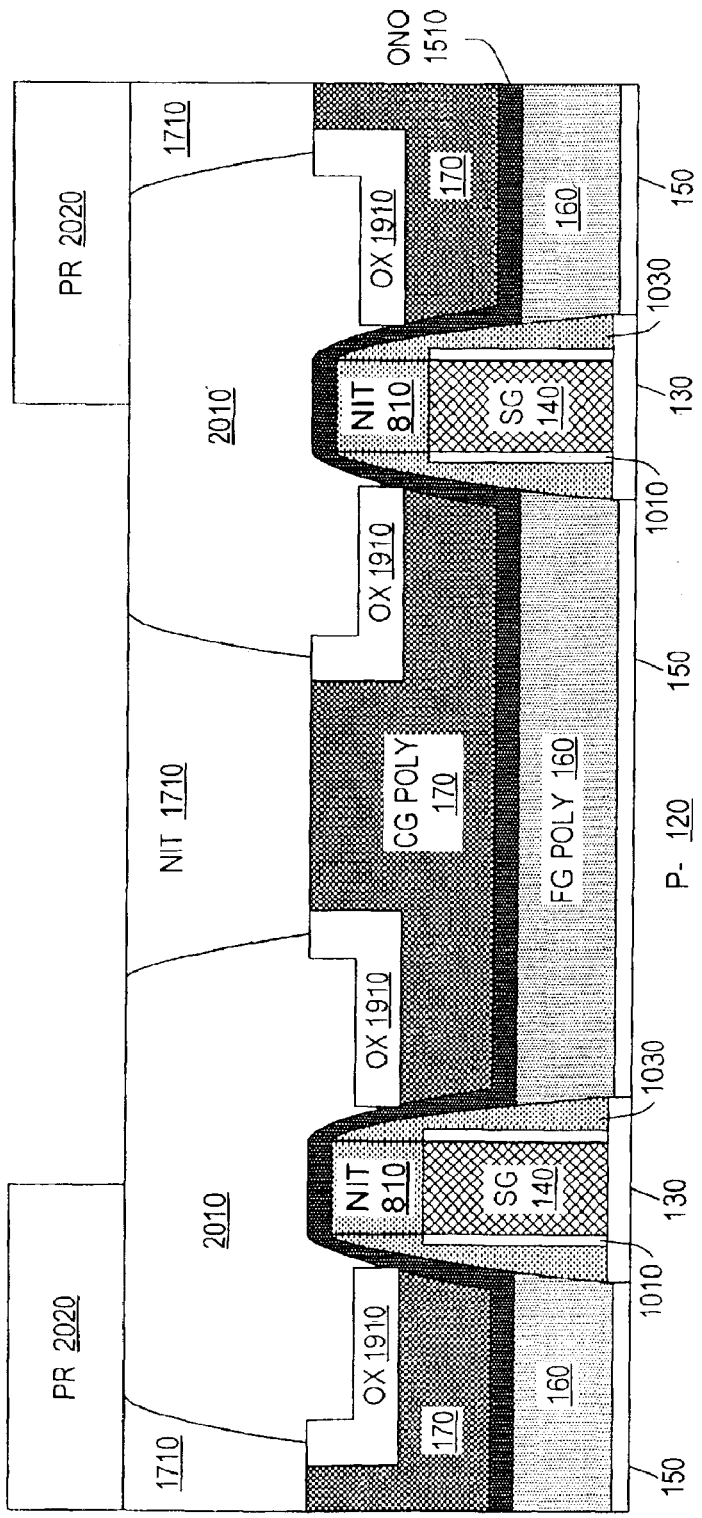
FIG. 20A (X-X')

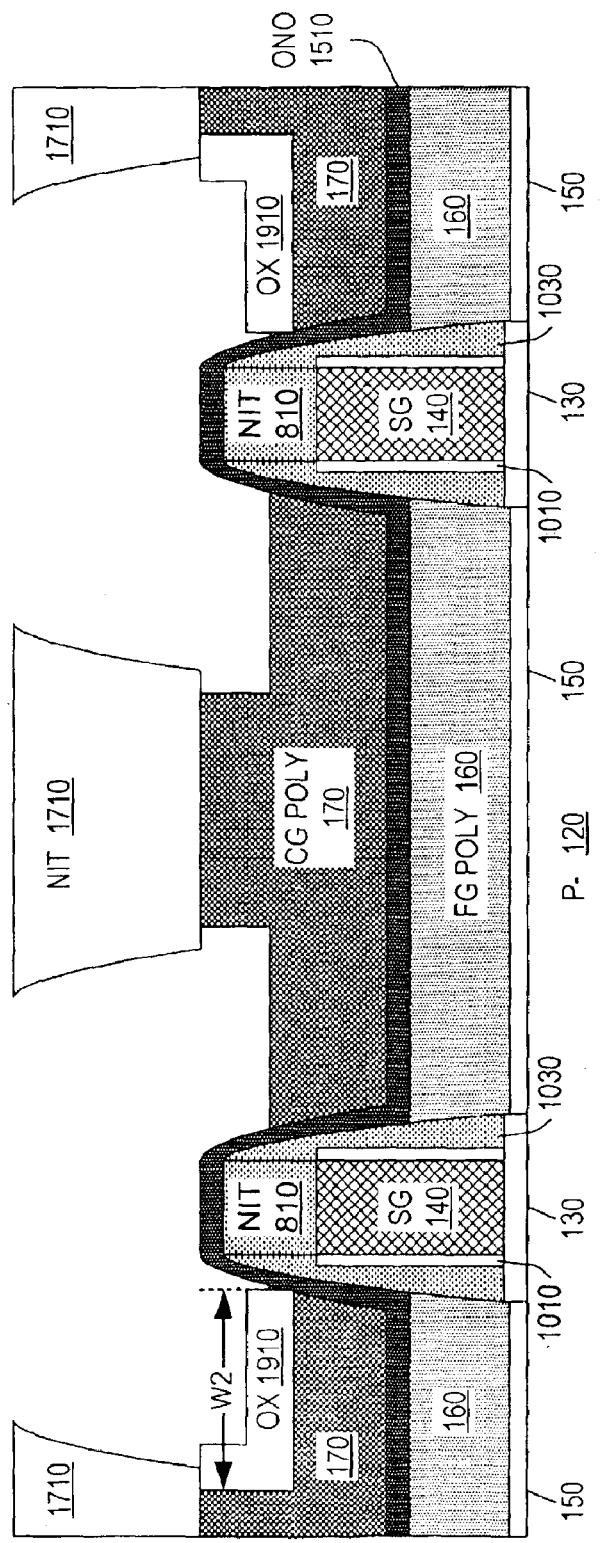
FIG. 21 (X-X')

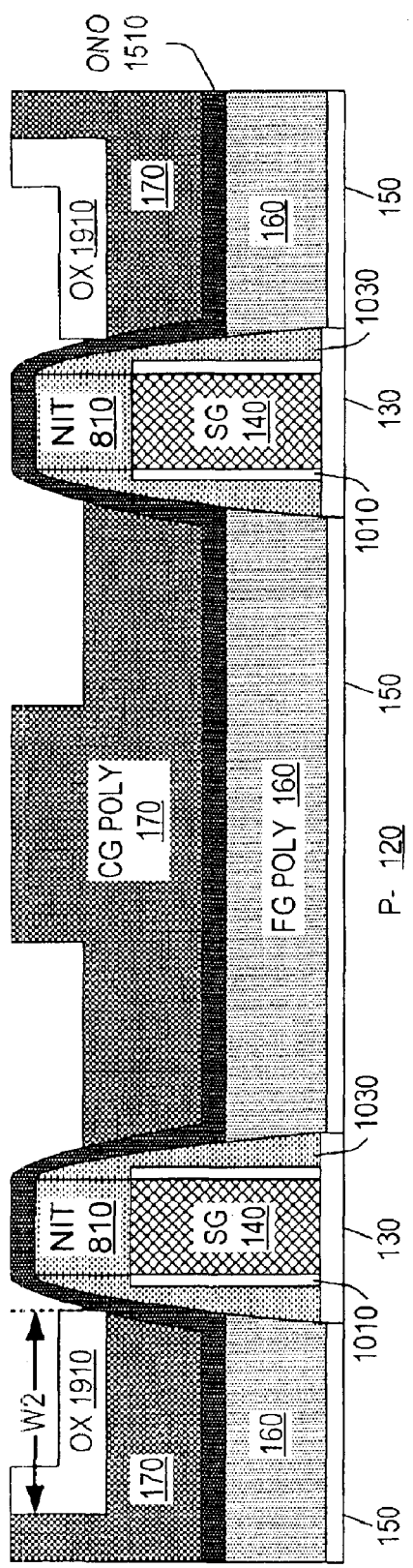
FIG. 22A (X-X')
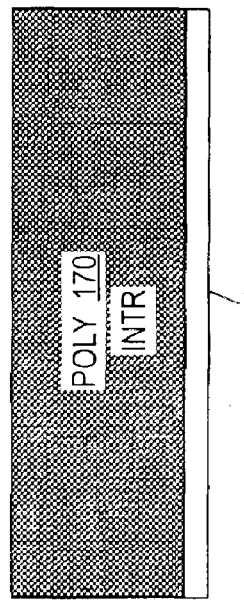
FIG. 22B

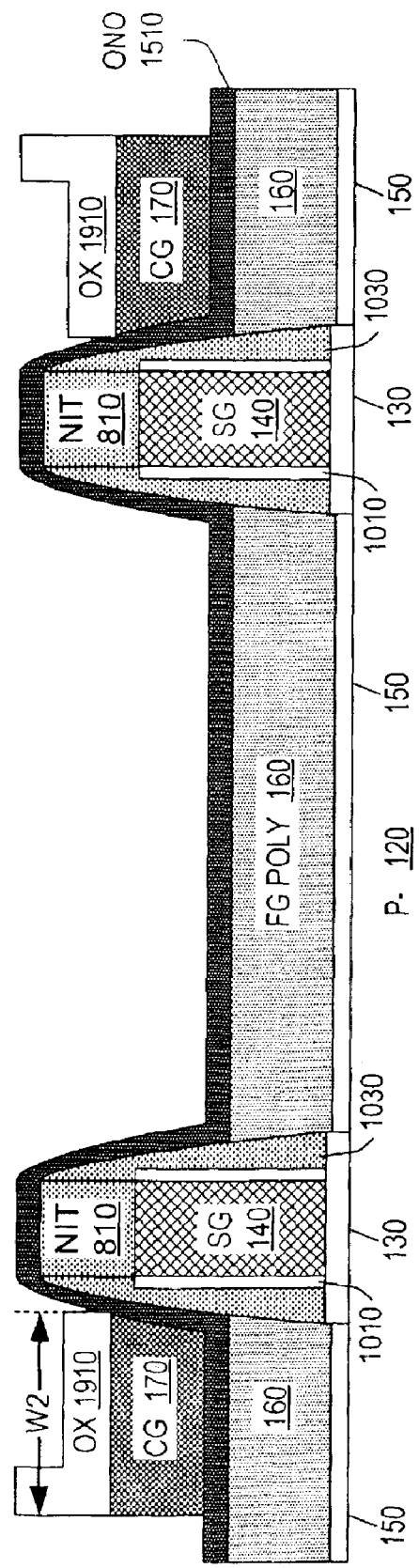
FIG. 23 (X-X')

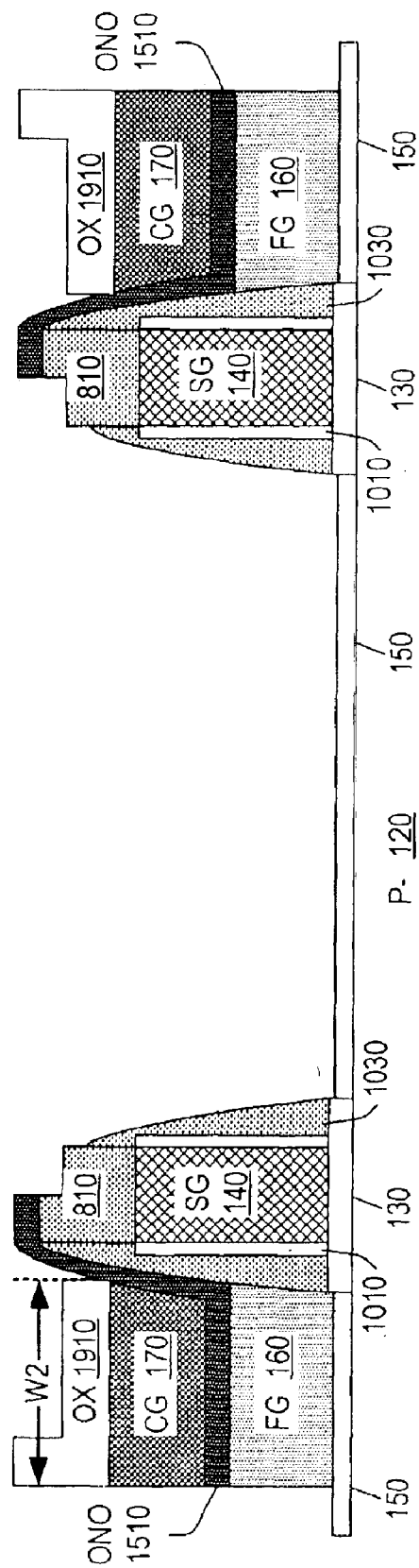
FIG. 24 (X-X')

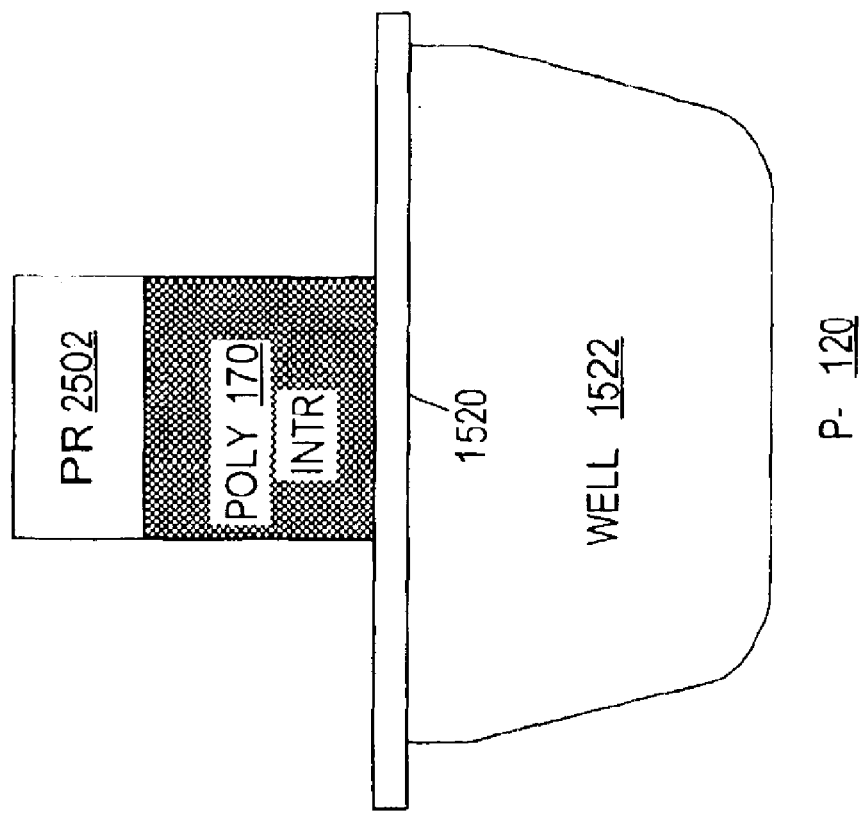

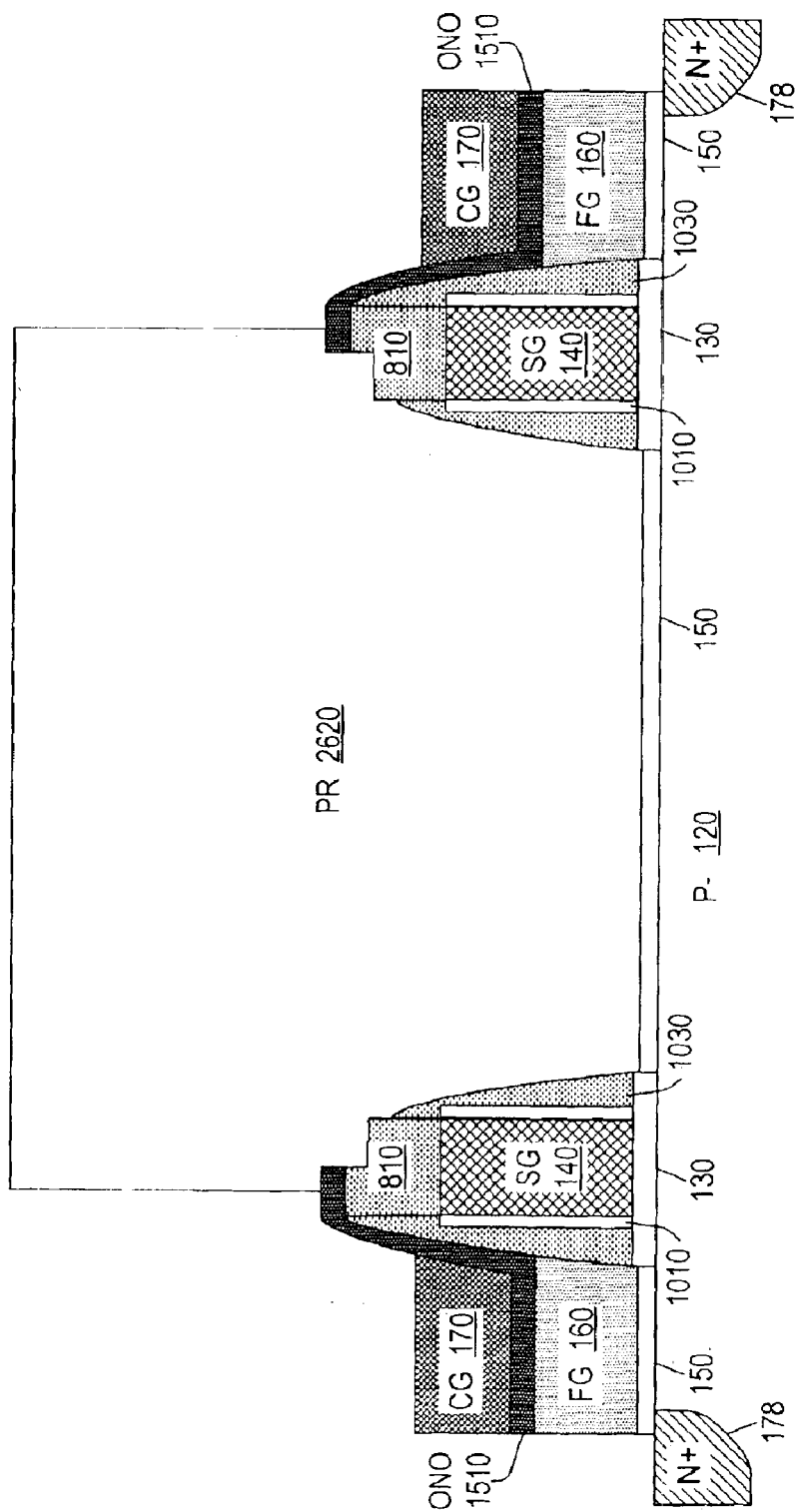
FIG. 26A (X-X')

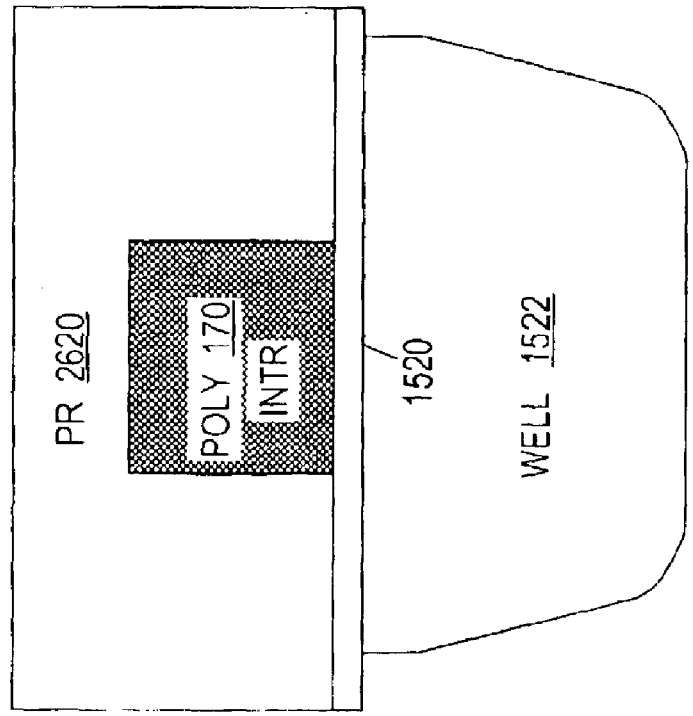

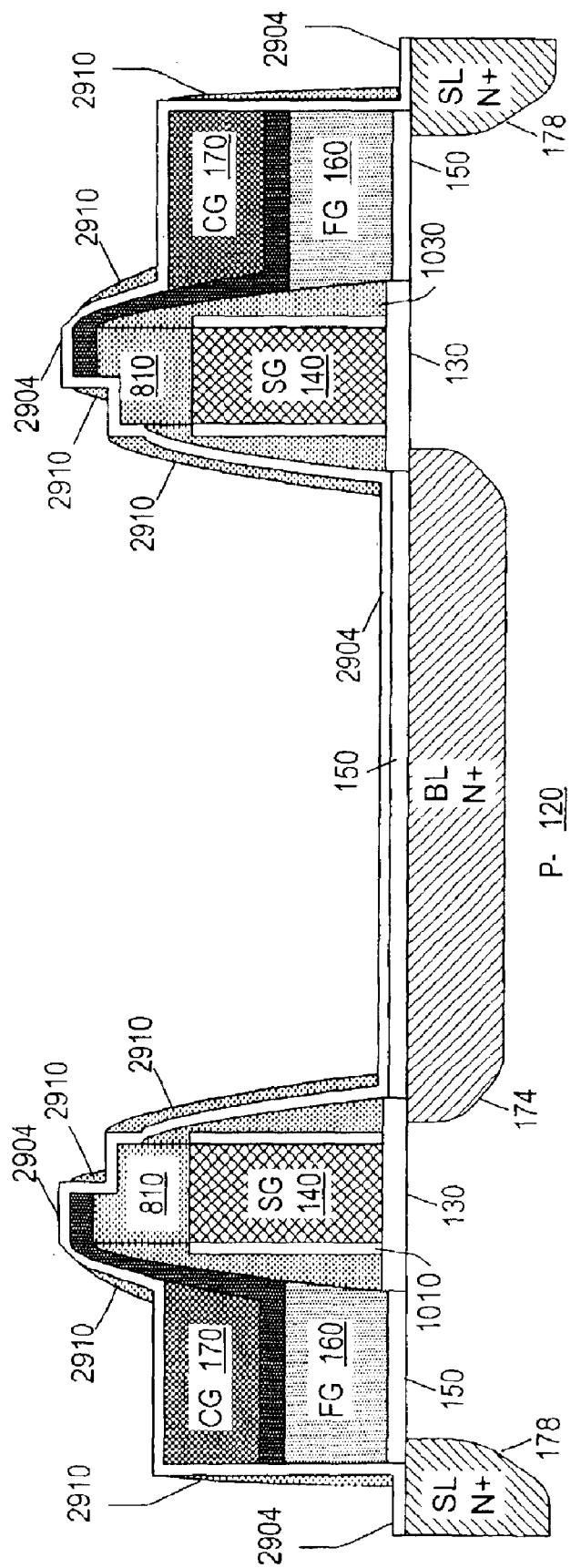
FIG. 29A (X-X')

NONVOLATILE MEMORIES AND METHODS OF FABRICATION

CROSS REFERENCE TO RELATED APPLICATIONS

The present application is a continuation-in-part of U.S. patent application Ser. No. 10/393,212 filed on Mar. 19, 2003 and incorporated herein by reference.

BACKGROUND OF THE INVENTION

The present invention relates to nonvolatile memories.

FIG. 1 shows a cross section of a flash memory cell described in U.S. Pat. No. 6,057,575 issued May 2, 2000 to Jenq. The cell is formed in and over a semiconductor substrate 120. Silicon dioxide 130 is thermally grown on substrate 120. Select gate 140 is formed on oxide 130. Silicon dioxide 150 is thermally grown on a region of substrate 120 not covered by the select gate. ONO 154 (a sandwich of a layer of silicon dioxide, a layer of silicon nitride, and a layer of silicon dioxide) is formed on select gate 140. Floating gate 160 is formed on dielectric layers 150, 154. A portion of floating gate 160 overlies the select gate 140.

ONO layer 164 is formed on the floating and select gates. Control gate 170 is formed on ONO 164. The control gate overlies floating gate 160 and select gate 140.

N+ source and drain regions 174, 178 are formed in substrate 120.

The cell is programmed by hot electron injection from the cell's channel region 180 (a P type region of substrate 120) to floating gate 160. The cell is erased by Fowler-Nordheim tunneling of electrons from floating gate 160 to source region 178.

The cell is fabricated by a self-aligned process in which the left and right edges of floating gate 160 and control gate 170 are defined by a single mask.

Another self-aligned fabrication process is described in Naruke et al., "A New Flash-Erase EEPROM Cell with a Sidewall Select-Gate on Its Source Side", IEDM Technical Digest 1989, pages 603–606. In that process, the floating and control gates are formed first in a stacked configuration. Then the select gate is formed as a sidewall spacer on a sidewall of a structure including the floating and control gates.

SUMMARY

This section summarizes some features of the invention. Other features are described in subsequent sections. The invention is defined by the appended claims which are incorporated into this section by reference.

The present invention includes self-aligned memory structures (the structures in which different features are defined by a single mask), but the invention is not limited to such structures.

In some embodiments, a floating gate layer (e.g. doped polysilicon) is formed over the select gate. The floating gate layer is removed from over at least a portion of the select gate. In some embodiments, this is done by an unmasked etch. A dielectric (e.g. ONO) is formed over the floating gate layer, and a control gate layer is formed over the dielectric. The control gate layer has an upward protrusion over the select gate. Then another layer, e.g. silicon nitride, is formed on the control gate layer, but the protrusions of the control gate layer are exposed. This can be achieved by a deposition of the silicon nitride followed by a CMP (chemical mechanical polishing), with the CMP stopping on the control gate layer protrusion. The exposed portion of the control gate layer is etched selectively to the silicon nitride until the control gate layer is removed from over at least a portion of the select gate. Then another layer is formed on the exposed portion of the control gate layer. This is thermally grown silicon dioxide in some embodiments. Then the silicon nitride is removed. The control gate layer, the ONO, and the floating gate layer are etched selectively to the silicon dioxide to define the control and floating gates.

The invention is not limited to these embodiments. Other features of the invention are described below. The invention is defined by the appended claims.

BRIEF DESCRIPTION OF THE DRAWINGS

FIGS. 10, 11, 12, 13A, 13B, 14, 15A, 15B, 16A, 16B, 17A, 17B, 18, 19, 20A show cross sections of the memory of FIG. 2 in the process of fabrication.

FIGS. 21, 22A, 22B, 23, 24, 25, 26A, 26B show cross sections of the memory of FIG. 2 in the process of fabrication.

FIGS. 27, 28, 29A, 29B show cross sections of the memory of FIG. 2 in the process of fabrication.

DESCRIPTION OF SOME EMBODIMENTS

The embodiments described in this section illustrate but do not limit the invention. The invention is not limited to particular materials, process steps, or dimensions. The invention is defined by the appended claims.

Figure 1:
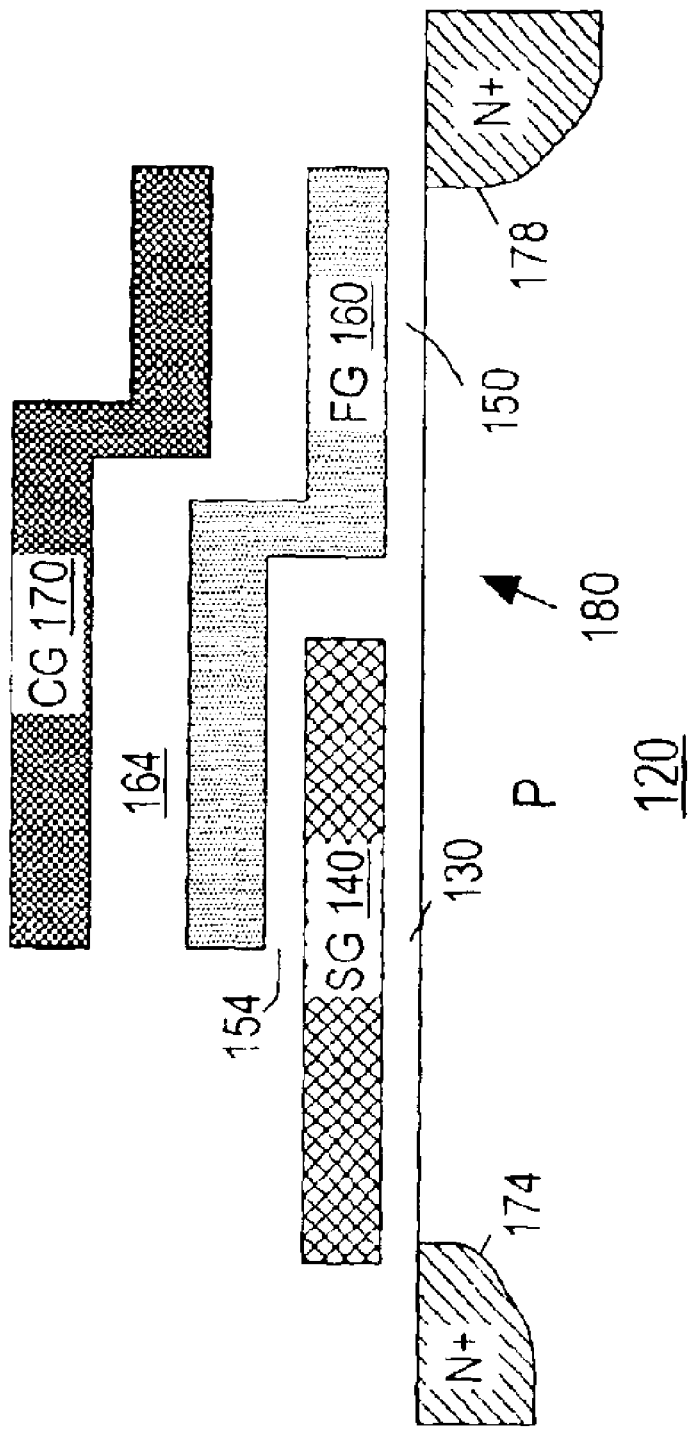
FIG. 1 shows a cross section of a prior art memory cell.
Figure 2:
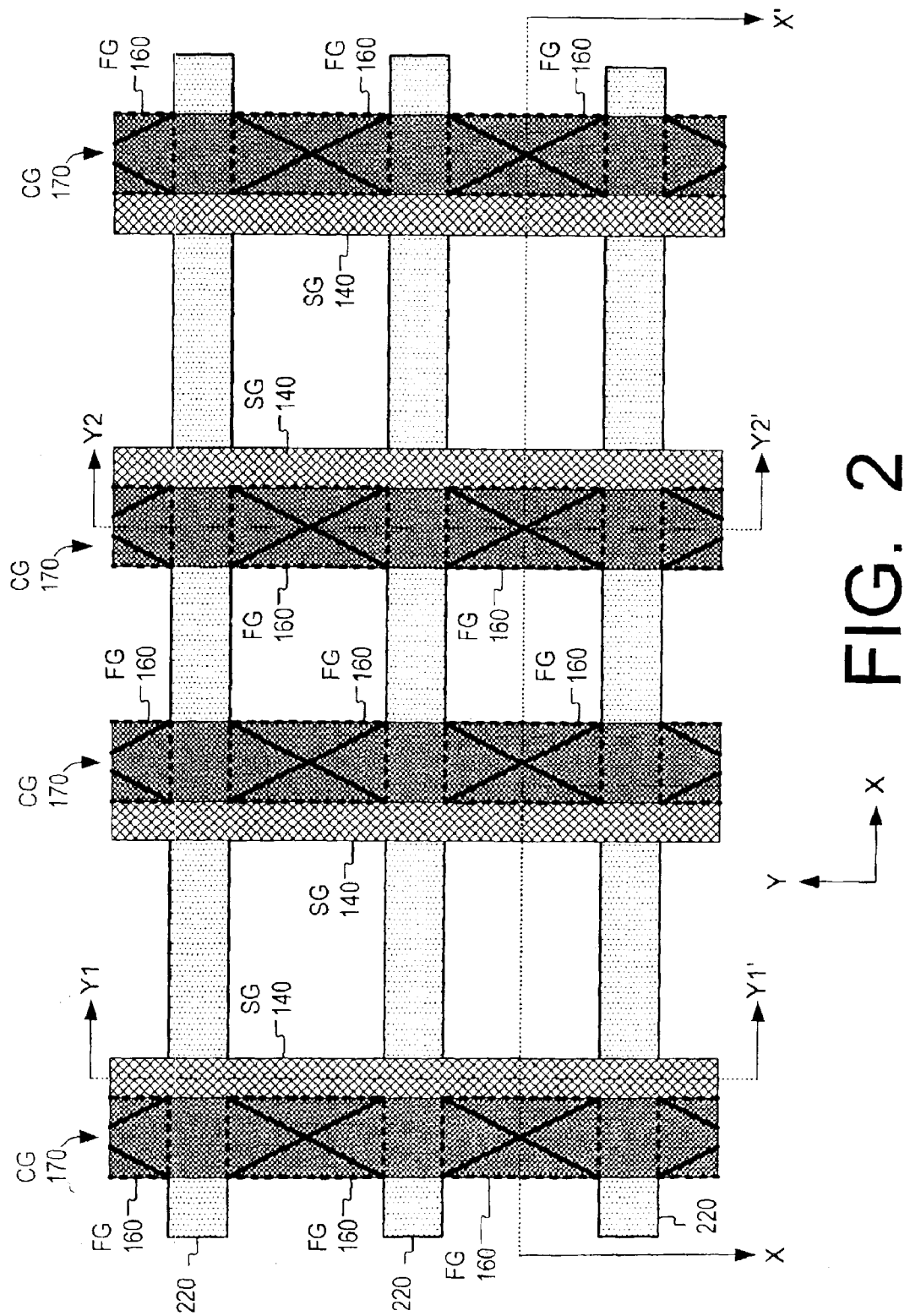
FIG. 2 is a top view of an intermediate structure obtained in the fabrication of a memory according to one embodiment of the present invention.
Figure 3:
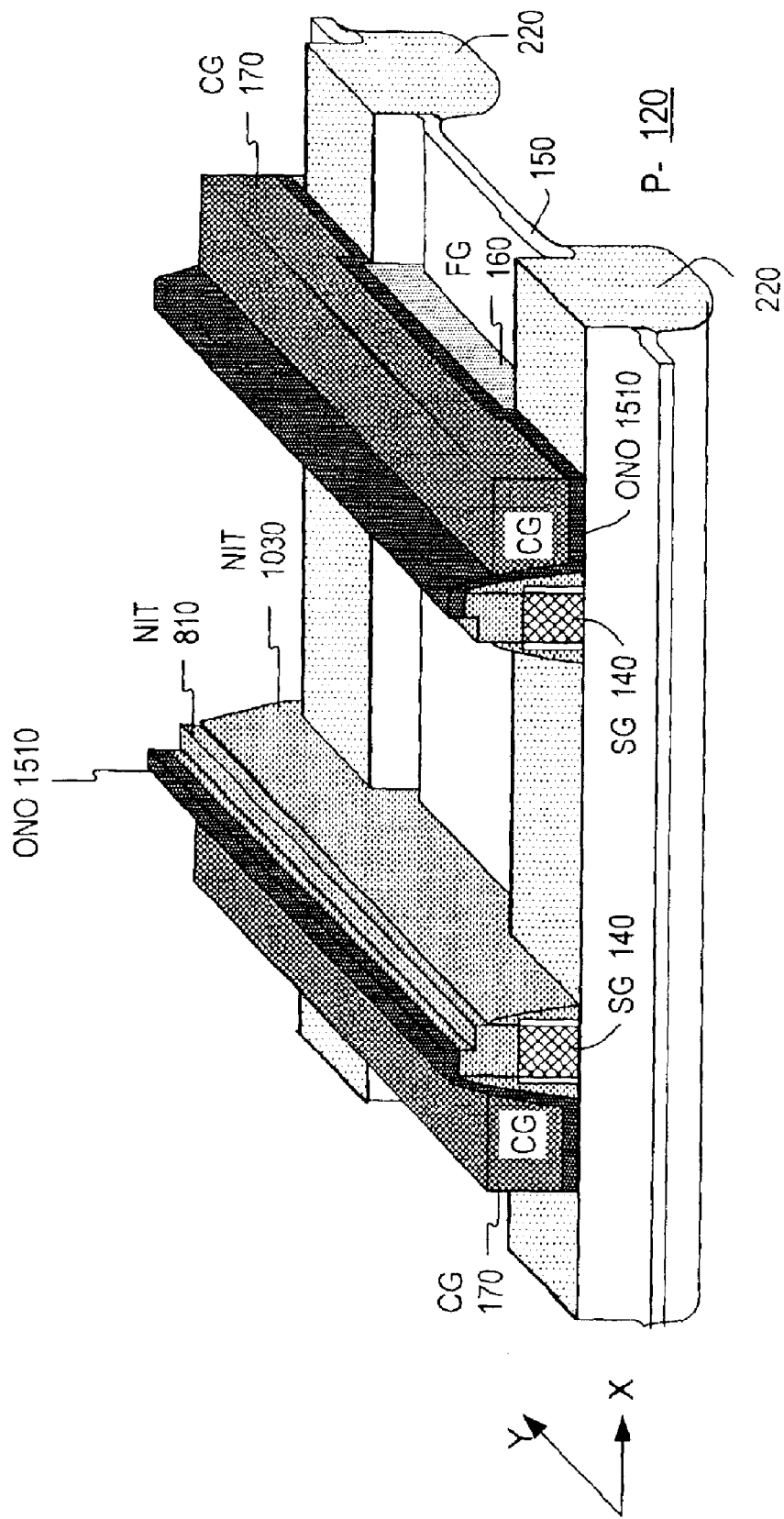
FIG. 3 is a perspective view of the memory of FIG. 2 in the process of fabrication.

FIG. 2 is a top view showing some features of a split gate flash memory array in the process of fabrication according to one embodiment of the present invention. FIG. 3 is a perspective view showing additional features. Each memory cell includes a floating gate 160, a control gate 170, and a select gate 140. The floating, control and select gates are insulated from each other and from semiconductor substrate 120 (e.g. monocrystalline silicon). Each control gate 170 is part of a control gate line, also referenced by numeral 170, that extends in the Y direction across the array. In some embodiments, the Y direction is a row direction, and each control gate line 170 provides the control gates for one row of the memory cells. Different control gate lines 170 may or may not be electrically tied together. Floating gates 160 underlie the control gates. The position of each floating gate 160 is shown with a cross in FIG. 2. Each select gate 140 is part of a select gate line, also referenced at 140, extending across the array in the Y direction. Substrate isolation regions 220 (field isolation regions) extend in the X direction. In some embodiments, the X direction is the column (bitline) direction. Each region 220 traverses the entire array. Each select gate line 140 and each control gate line 170 crosses over all of the regions 220.

Subsequent figures illustrate vertical cross sections of intermediate structures obtained during the memory fabrication. The sectional planes are indicated in FIG. 2 by lines X–X', Y1–Y1', and Y2–Y2'. The line X–X' passes in the X direction between substrate isolation regions 220. The line Y1–Y1' passes in the Y direction through a select gate line 140. The line Y2–Y2' passes in the Y direction through a control gate line 170.

Figure 4:
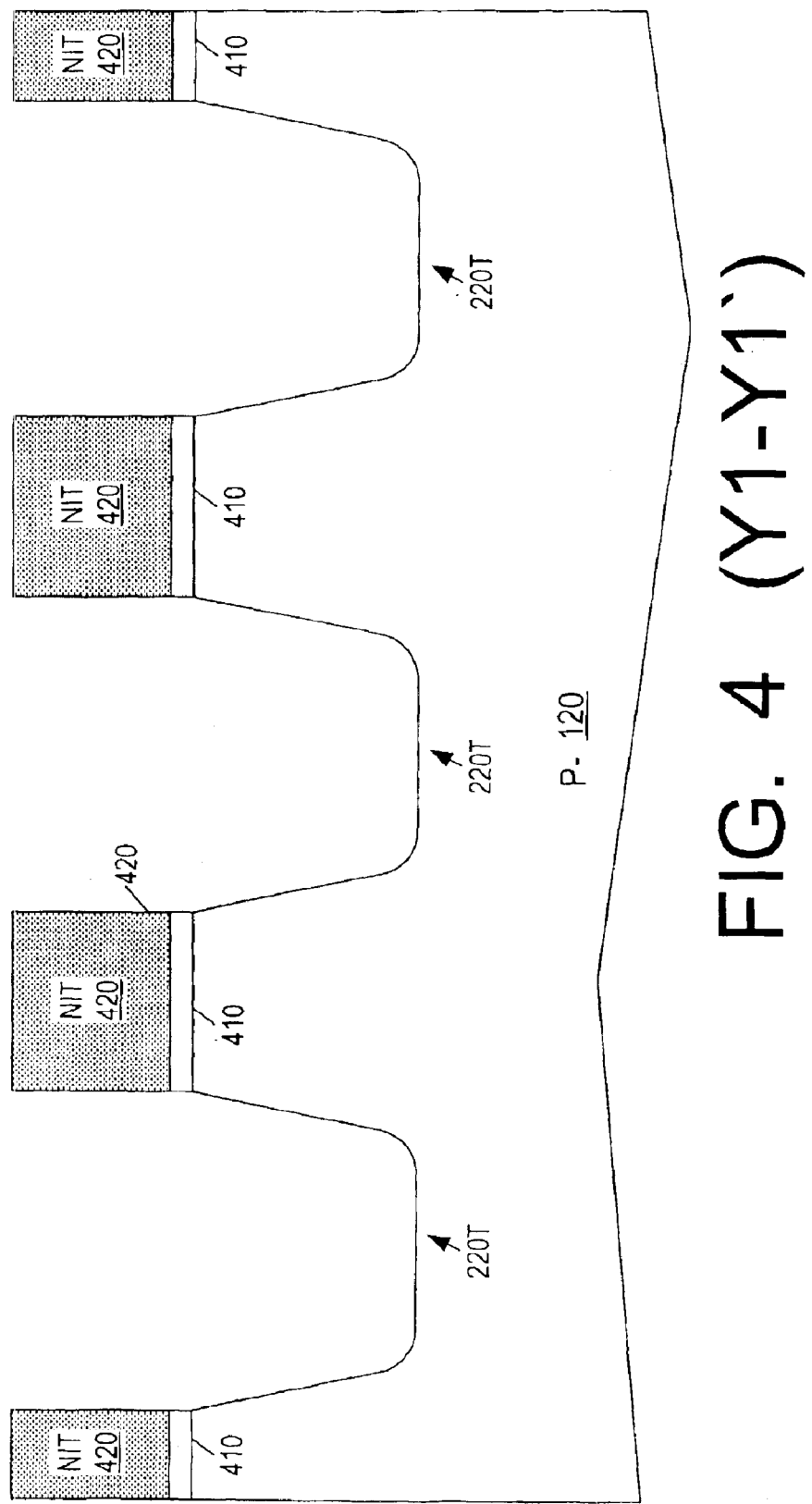
FIGS. 4–8 show cross sections of the memory of FIG. 2 in the process of fabrication.

In one embodiment, the memory is fabricated as follows. Substrate isolation regions 220 are formed in P doped substrate 120 by shallow trench isolation ("STI") technology. More particularly, as shown in FIG. 4 (the Y1–Y1' cross section), a silicon dioxide layer 410 (pad oxide) is formed on substrate 120 by thermal oxidation or some other technique. Silicon nitride 420 is deposited on oxide 410. Nitride 420 is patterned photolithographically, using a photoresist mask (not shown), to define isolation trenches 220T. Oxide 410 and substrate 120 are etched through the openings in nitride 420. Trenches 220T are formed in the substrate as a result. Each trench 220T traverses the entire memory array in the X direction.

Nitride 420 is subjected to a timed wet etch to recess the vertical edges of the nitride layer away from trenches 220T. See FIG. 5 (cross section Y1–Y1'). Oxide 410 is also recessed away from the trenches in this step.

A thin layer 220.1 of silicon dioxide is thermally grown on the exposed silicon surfaces to round the edges of trenches 220T. Then silicon dioxide 220.2 is deposited using a high density plasma technique (HDP). Oxide 220.2 fills the trenches and initially covers the nitride 420. Oxide 220.2 is polished by chemical mechanical polishing (CMP). The polishing stops on nitride 420. A planar top surface is provided.

In the subsequent figures and FIGS. 2 and 3, the layers 220.1, 220.2 are shown as a single layer 220.

Figure 5:
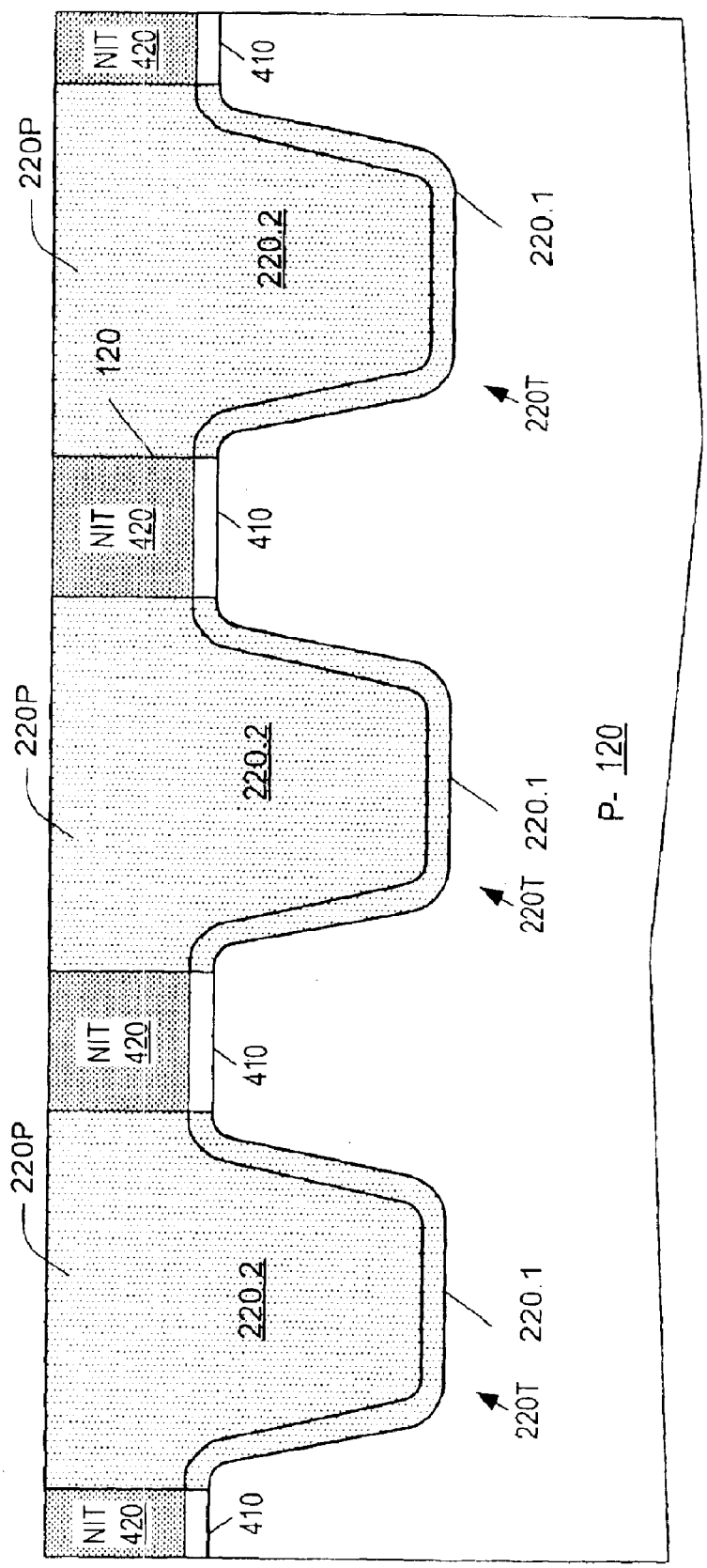

As shown in FIG. 5, oxide 220 protrudes above the substrate 120 by an amount equal to the combined thickness of nitride 420 and oxide 410. The protruding portions of oxide 220 are shown at 220P.

Figure 6:
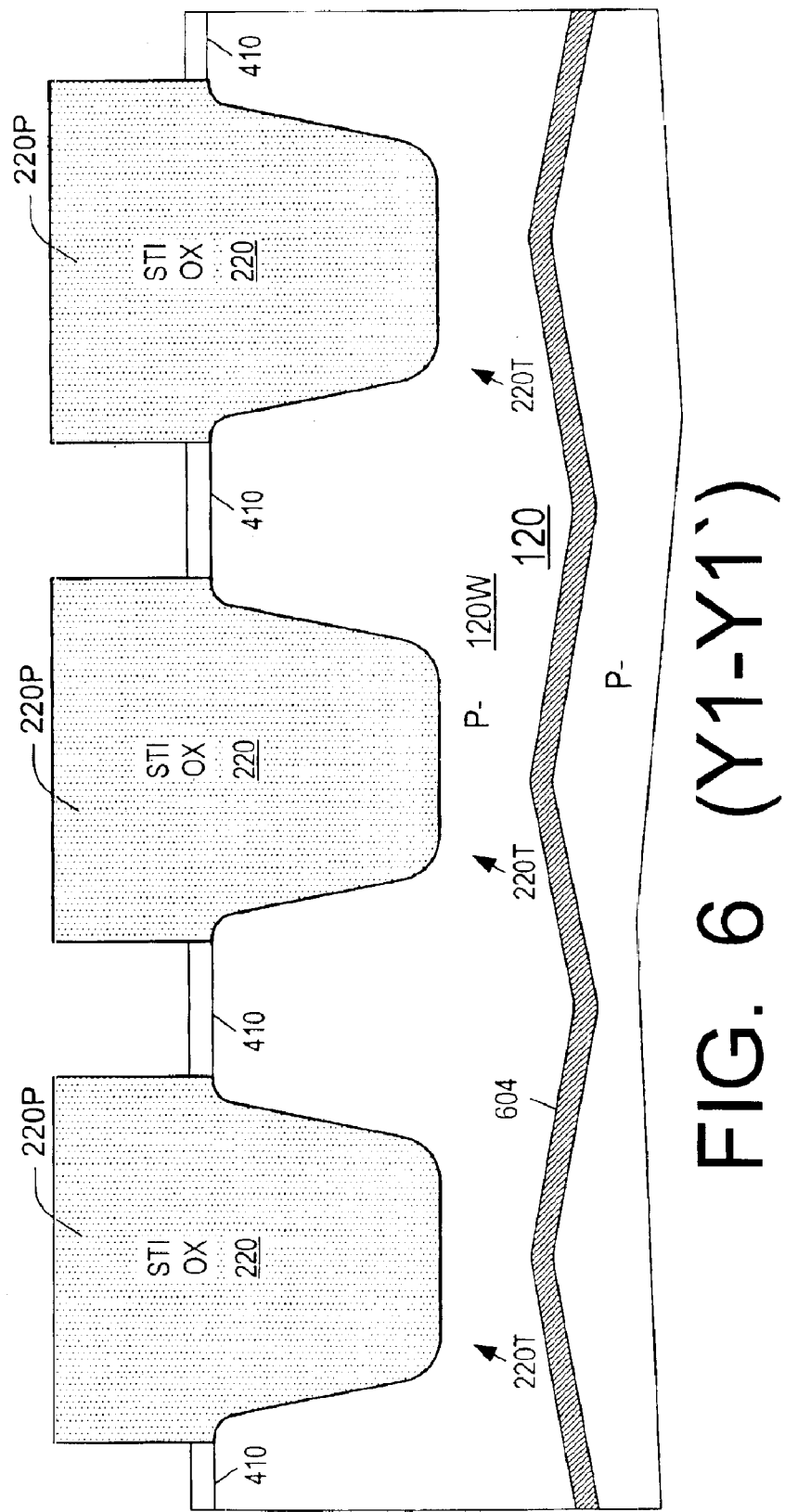

Nitride 420 is removed selectively to oxide 220 (FIG. 6, cross section Y1–Y1'). This can be done by a wet etch (e.g. with phosphoric acid).

Dopant is implanted into substrate 120 to form an N type region 604 underlying the memory array. Dopant is also implanted into the substrate around the array to form an N type region (not shown) extending from the top surface of substrate 120 down to region 604. These implants create a fully isolated P well 120W for the memory array. Region 604 is not shown in the subsequent drawings.

Figure 7:
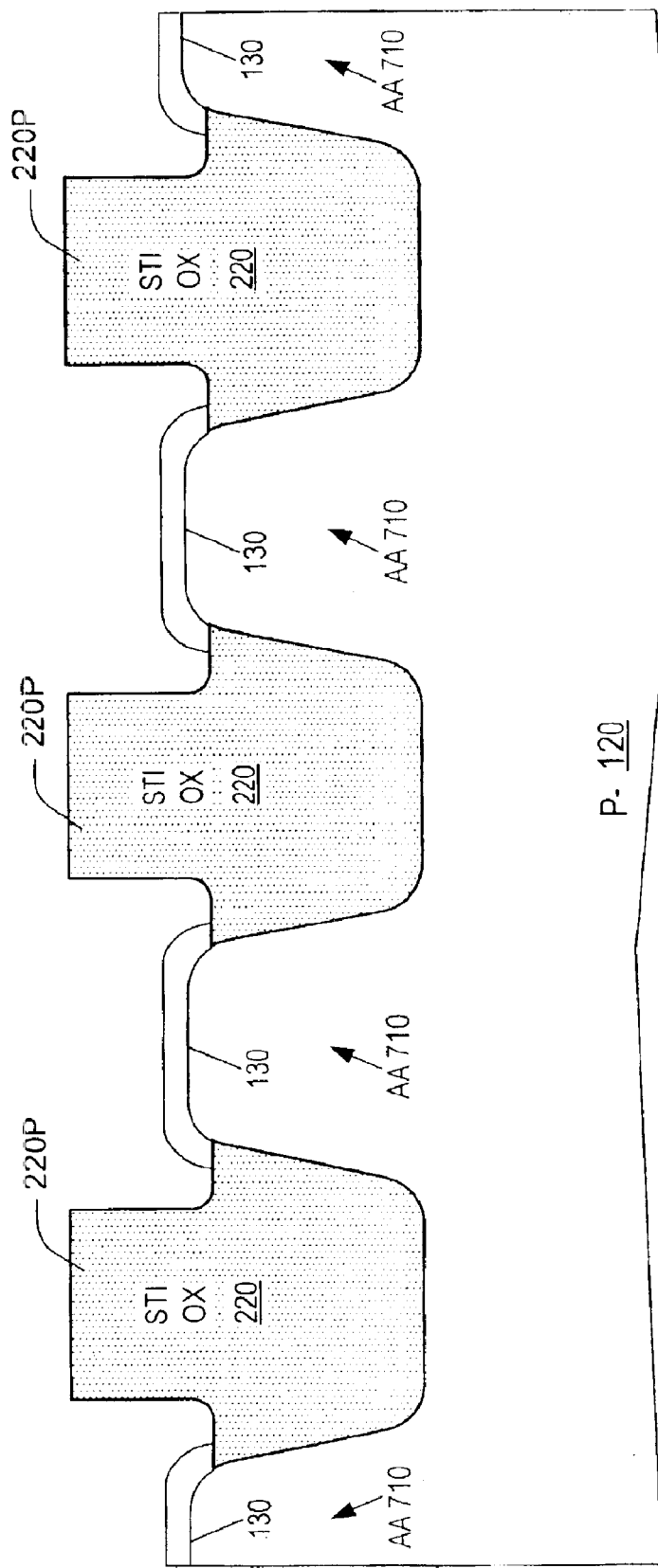

Oxide 220 is subjected to an etch (FIG. 7, cross section Y1–Y1'). The etch includes a horizontal component that causes the sidewalls of oxide 220 to be laterally recessed away from active areas 710 (the substrate areas not occupied by trenches 220T). The etch can be an isotropic wet etch. A buffered oxide etch or a dilute HF (DHF) etch is used in some embodiments. This etch will result in improved capacitive coupling between the floating and control gates. See U.S. patent application Ser. No. 10/262,785 filed Oct. 1, 2002 by Yi Ding and incorporated herein by reference.

Portions 220P of oxide 220 are not etched away, and they continue to protrude above the top surface of substrate 120. An exemplary final thickness of the protruding portions 220P is 0.12 μm for a 0.18 μm fabrication process (a process with a 0.18 μm minimum line width). The exemplary dimensions given in this section assume a 0.18 μm fabrication process unless mentioned otherwise.

Pad oxide 410 is removed during the etch of oxide 220.

Silicon dioxide 130 is thermally grown on the exposed areas of substrate 120 to provide gate dielectric for the select transistors. An exemplary thickness of oxide 130 is 120 Å.

Figure 8:
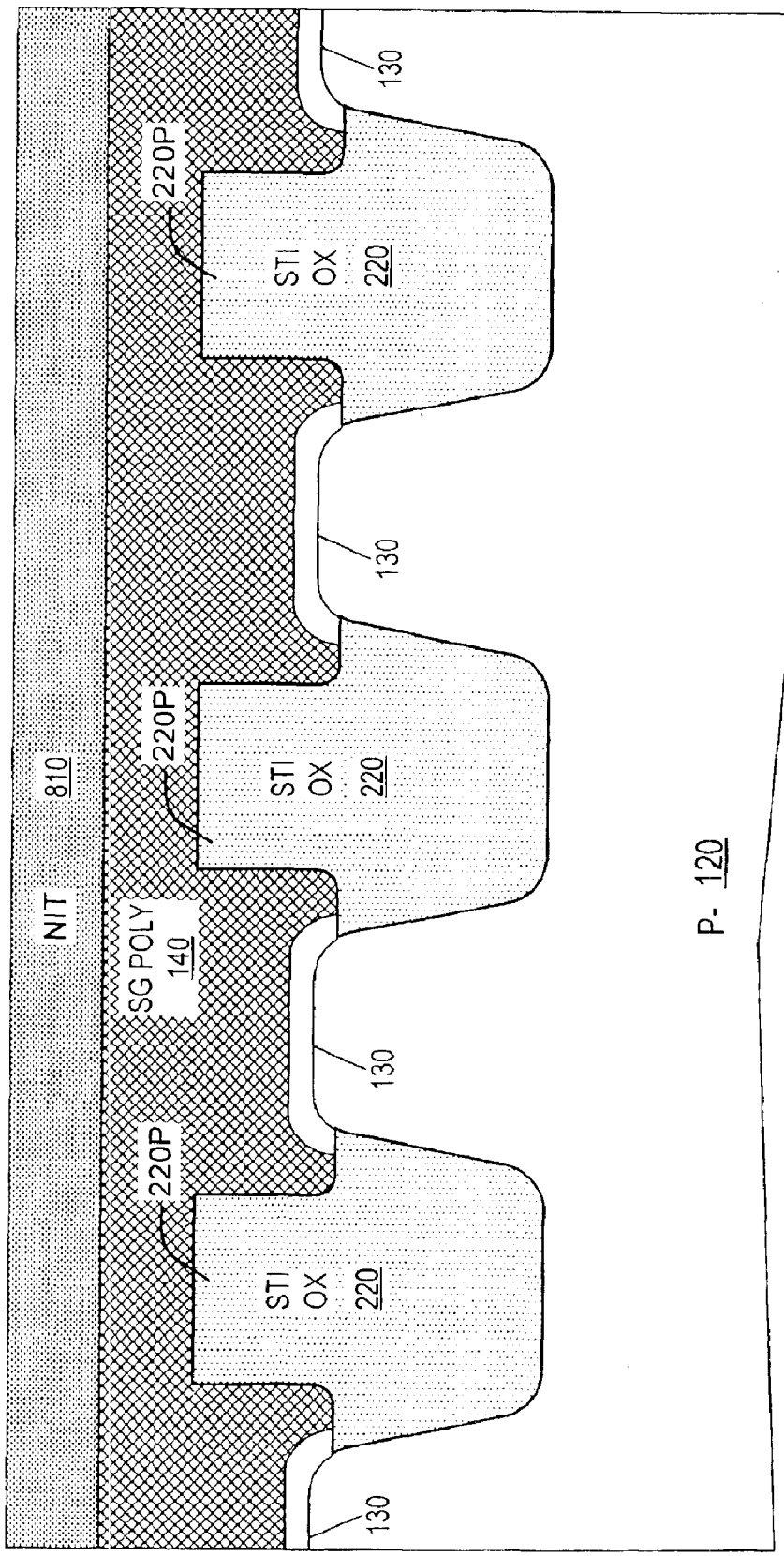

As shown in FIG. 8 (cross section Y1–Y1'), a conductive polysilicon layer 140 is formed over the structure by a conformal deposition process (e.g. low pressure chemical vapor deposition, "LPCVD"). Polysilicon 140 fills the spaces between the oxide protrusions 220P. The top polysilicon surface is planar because the polysilicon portions deposited on the sidewalls of protrusions 220P meet together.

Non-conformal deposition processes, whether known or to be invented, can also be used. If the top surface of polysilicon 140 is not planar, it is believed that the polysilicon 140 can be planarized after the deposition using known techniques (e.g. spinning a photoresist layer over the polysilicon 140 and then simultaneously etching the resist and the polysilicon at equal etch rates until all of the photoresist is removed). The bottom surface of polysilicon 140 is non-planar as it goes up and down over the oxide protrusions 220P.

An exemplary final thickness of polysilicon 140 is 0.06 μm over the active areas.

Silicon nitride 810 is deposited on polysilicon 140, by LPCVD for example, to an exemplary thickness of 1500 Å. If desired, a pad oxide layer (not shown) can be formed on polysilicon 140 before the nitride deposition. The pad oxide layer will provide an additional protection for the select gates during the etch of control gate polysilicon 170 described below in connection with FIG. 18.

In some embodiments, the top surface of polysilicon 140 and/or nitride 810 is not planar.

Figure 9:
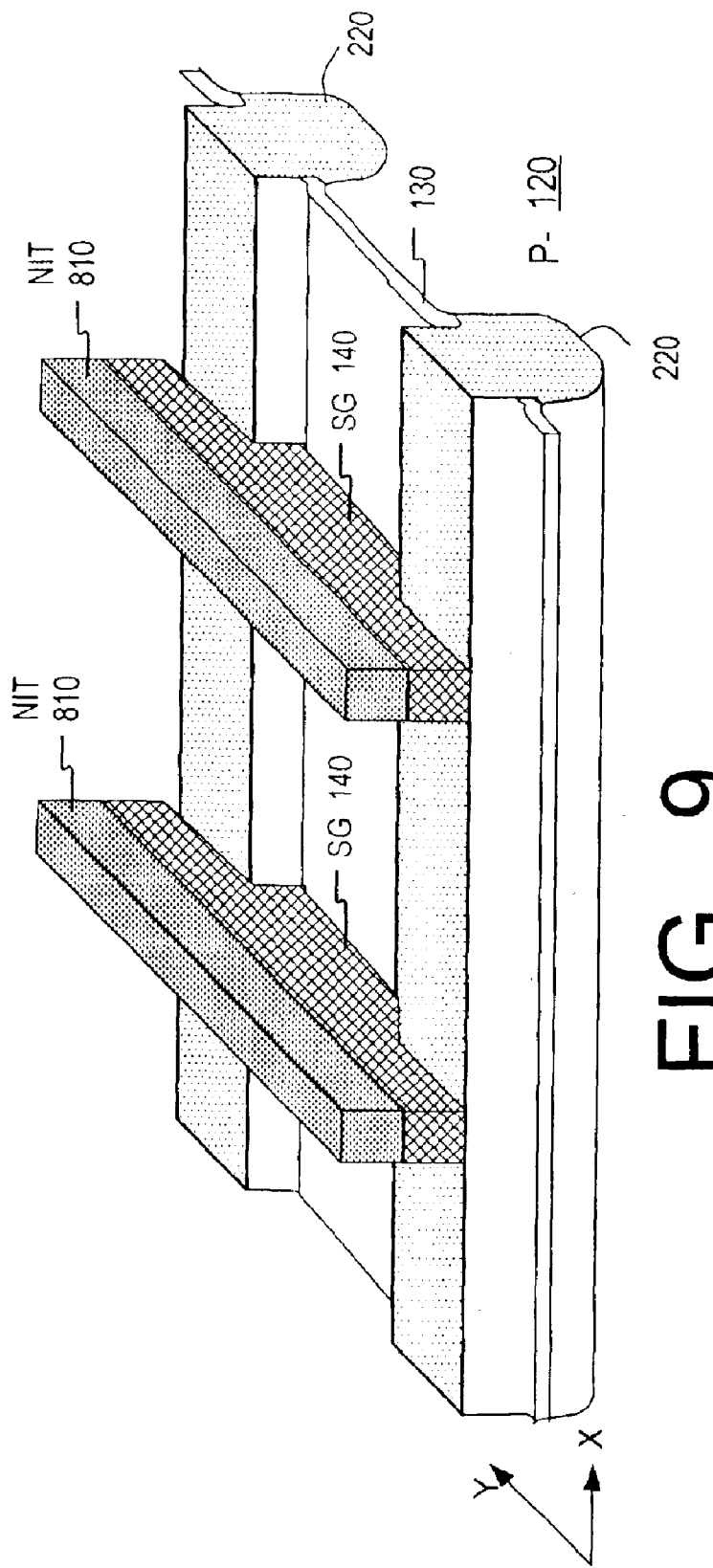
FIG. 9 is a perspective view of the memory of FIG. 2 in the process of fabrication.

The wafer is coated with a photoresist layer (not shown). The resist is patterned to define select gate lines 140. See FIG. 2, and see also the perspective view in FIG. 9. Each select gate line 140 extends in the Y direction through the entire array. The memory array geometry is not sensitive to a misalignment between the mask defining the lines 140 and the mask defining the isolation trenches 220T (FIG. 4) except possibly at the boundary of the memory array.

Silicon nitride 810 is etched through the resist openings. The resist is removed, and polysilicon 140 is etched away where exposed by nitride 810. Select gate lines 140 are formed as a result. (In an alternative embodiment, the resist defining the nitride 810 is removed after the etch of polysilicon 140.)

As shown in FIG. 10 (cross section X–X'), the structure is oxidized to grow silicon dioxide 1010 on the sidewalls of select gate lines 140. Then a thin conformal silicon nitride layer 1030 is deposited and etched anisotropically, without a mask over the memory array, to form spacers on the sidewalls of each structure consisting of a select gate line 140, the overlying nitride 810, and the sidewall oxide 1010. Formation of silicon nitride spacers is described, for example, in U.S. Pat. No. 6,355,524 issued Mar. 12, 2002 to H. Tuan et al. and incorporated herein by reference.

A blanket oxide etch removes the exposed portions of silicon dioxide 130. Silicon dioxide 150 (FIG. 11, cross section X–X') is thermally grown on substrate 120 to a desired thickness, e.g. 90 Å.

Floating gate polysilicon 160 is deposited over the structure, by LPCVD for example, and is doped during or after the deposition. Polysilicon 160 is sufficiently thick to ensure that the top surface of layer 160 is at least as high as the top surface of nitride 810. In particular, the top surface of polysilicon 160 includes regions 160T between the select gates 140. Regions 160T are at least as high as the top surface of nitride 810.

Layer 160 is planarized by a CMP process that stops on nitride 810, or by some other process. See FIG. 12 (cross section X–X'). The top surface of polysilicon 160 becomes coplanar with the top surface of nitride 810. CMP processes and slurries are known that allow one to avoid dishing in the top surface of the polysilicon layer.

Then polysilicon 160 is etched without a mask over the memory array. See FIGS. 13A (cross section X–X') and 13B (cross section Y2–Y2'). The etch stops when trench oxide 220 becomes exposed. A suitable overetch is performed to completely remove the polysilicon 160 from the top surface of oxide 220. In some embodiments, the final thickness of layer 160 is 1200 Å.

Optionally, a timed etch of oxide 220 is performed to recess the top surface of oxide 220 below the surface of polysilicon 160. See FIG. 14 (cross section Y2–Y2'). This etch will improve the capacitive coupling between the floating and control gates. See the aforementioned U.S. Pat. No. 6,355,524. In the embodiment of FIG. 14, the oxide 220 continues to protrude above the top surface of substrate 120, as shown at 220P, by at least 0.10 µm. In other embodiments, the oxide 220 does not protrude above the substrate after the etch.

ONO layer 1510 (FIG. 15A, cross section X–X') is formed over the structure. For example, a silicon dioxide layer can be thermally grown on polysilicon 160 or deposited by a high temperature oxidation process (HTO) to a thickness of 50 Å. (HTO is described, for example, in U.S. patent application published as no. 2002/0197888 on Dec. 26, 2002, incorporated herein by reference). Then a silicon nitride layer can be deposited by LPCVD to a thickness of 80 Å. Then another silicon dioxide layer can be deposited by HTO to a thickness of 50 Å. These processes and thickness values are exemplary and not limiting.

ONO 1510, polysilicon 160, and silicon dioxide 150 are removed from the memory peripheral areas 1512 (FIG. 15B). Suitable gate dielectric layers 1520 are formed on substrate 120 in the periphery by conventional means. In the example shown in FIG. 15B, the peripheral area includes a high voltage transistor area 1512H and a low voltage transistor area 1512L. Layer 1520 is formed as follows. Silicon dioxide is grown thermally or deposited by HTO to a thickness of 140 Å in the areas 1512H, 1512L. This oxide is removed from the low voltage area 1512L by a masked etch. Then another silicon dioxide layer is formed by thermal oxidation in areas 1512L, 1512H to a thickness of 60 Å. As a result, the oxide thickness in the high voltage area 1512H increases from 140 Å to 200 Å. The top oxide layer in ONO 1510 (FIG. 15A) can be made thicker and/or densified during these steps. Alternatively, the entire top oxide layer of the ONO 1510 sandwich can be formed during the formation of oxide 1520 in the periphery.

FIG. 15B also shows wells 1522 formed in substrate 120 for the NMOS and PMOS transistors in peripheral area 1512. The wells can be formed, and the threshold voltage implants can be performed into the wells, before the fabrication of oxide 1520 using known techniques.

Control gate polysilicon layer 170 (FIG. 16A, cross section X–X', and FIG. 16B, peripheral area) is deposited on ONO 1510 and dielectric 1520. Polysilicon 170 is initially undoped ("intrinsic", shown as "INTR" in FIG. 16B). Then peripheral area 1512 is masked, and polysilicon 170 is doped N+ in the memory array area.

The top surface of polysilicon 170 is not planar. Layer 170 has a protruding portion 170.1 over each select gate line 140. The protrusions 170.1 will be used to define the control and floating gates without additional dependence on photolithographic alignment.

Figure 17B:
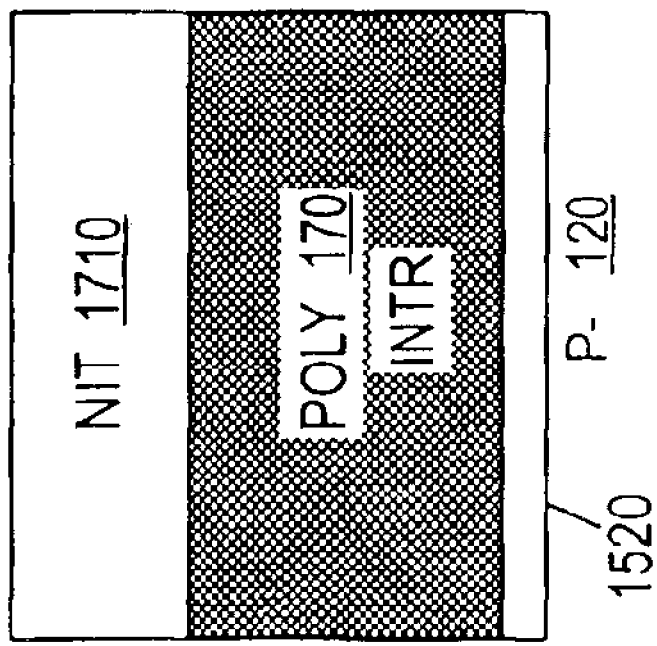

As shown in FIG. 16A, cavities 170C form in layer 170 between protrusions 170.1. As shown in FIG. 17A (cross section X–X'), these cavities are filled with some material 1710. In one embodiment, material 1710 is silicon nitride deposited on polysilicon 170 and planarized by CMP or some other process (e.g. etch-back). The memory array area has a planar top surface, with polysilicon 170 exposed. Nitride 1710 is also deposited in the peripheral area (FIG. 17B), but in some embodiments the polysilicon 170 is not exposed in the periphery by the nitride planarization. This is due to the fact that the floating gate polysilicon 160 has been removed in the periphery. Therefore, before the nitride 1710 planarization, the top level of nitride 1710 was lower in the periphery than in the array area. The nitride planarization process may or may not leave nitride 1710 in the periphery. In the example of FIG. 17B, nitride 1710 is not entirely removed from the periphery during the planarization.

Polysilicon 170 is etched without a mask selectively to nitride 1710. See FIG. 18 (cross section X–X'). This etch attacks the polysilicon portions 170.1 and removes the layer 170 from over at least a portion of each select gate line 140 to expose the ONO 1510. In the embodiment of FIG. 18, this etch continues after exposing the ONO layer to recess the top surface of polysilicon 170 below the top surface of ONO 1510. This is not necessary however. The polysilicon etch can stop as soon as the ONO layer becomes exposed. The width W1 of the exposed portion of polysilicon layer 170 adjacent to select gate 140 will be used to define the width of the control and floating gates in a self-aligned manner as will be illustrated below.

In some embodiments, the minimum thickness of polysilicon 170 (adjacent to select gate 140) is 0.18 µm, and the width W1 is slightly below 0.18 µm, e.g. 0.155 µm. In FIG. 18, the top surface of the exposed portion of polysilicon 170 is recessed. In another embodiment, polysilicon 170 has a planar top surface throughout the memory array area.

In the peripheral area (FIG. 17B), polysilicon 170 is protected by nitride 1710, so the peripheral area is unchanged by the polysilicon etch. If nitride 1710 was removed in the periphery during the nitride planarization process (described above in connection with FIG. 17A), then the polysilicon 170 can be protected in the periphery by an additional mask (not shown) during the polysilicon etch.

A protective layer 1910 (see FIG. 19, cross section X–X') is formed on the exposed portions of polysilicon 170. In one embodiment, layer 1910 is silicon dioxide formed by thermal oxidation of layer 170. An exemplary thickness of oxide 1910 is 500 Å. Layer 1910 can also be a conductive metal suicide formed selectively on polysilicon 170 by a salicide (self-aligned silicidation) technique.

As noted above (FIG. 18), the top surface of polysilicon 170 is recessed adjacent to select gates 140, and oxide 1910 forms on the vertical sidewalls of the recessed polysilicon portions, resulting in L-shaped oxide features. The sidewall oxidation consumes some of polysilicon 170 under the nitride 1710. The total width W2 (FIG. 19) of the polysilicon portion covered by oxide 1910 will define the width of the floating and control gates as explained below. In some embodiments, W2 is 0.18 μm.

As noted above, the top surface of polysilicon 170 can be planar after the etch of FIG. 18, before the formation of oxide 1910. In such embodiments, W2 is about equal to W1 because there is less polysilicon oxidation under the nitride 1710.

The periphery is protected by nitride 1710, and is unchanged during this step.

An antireflective coating layer (ARC) 2010, shown in FIG. 20A, is flowed over the wafer and cured. The structure has a planar top surface after this step.

Figure 20B:
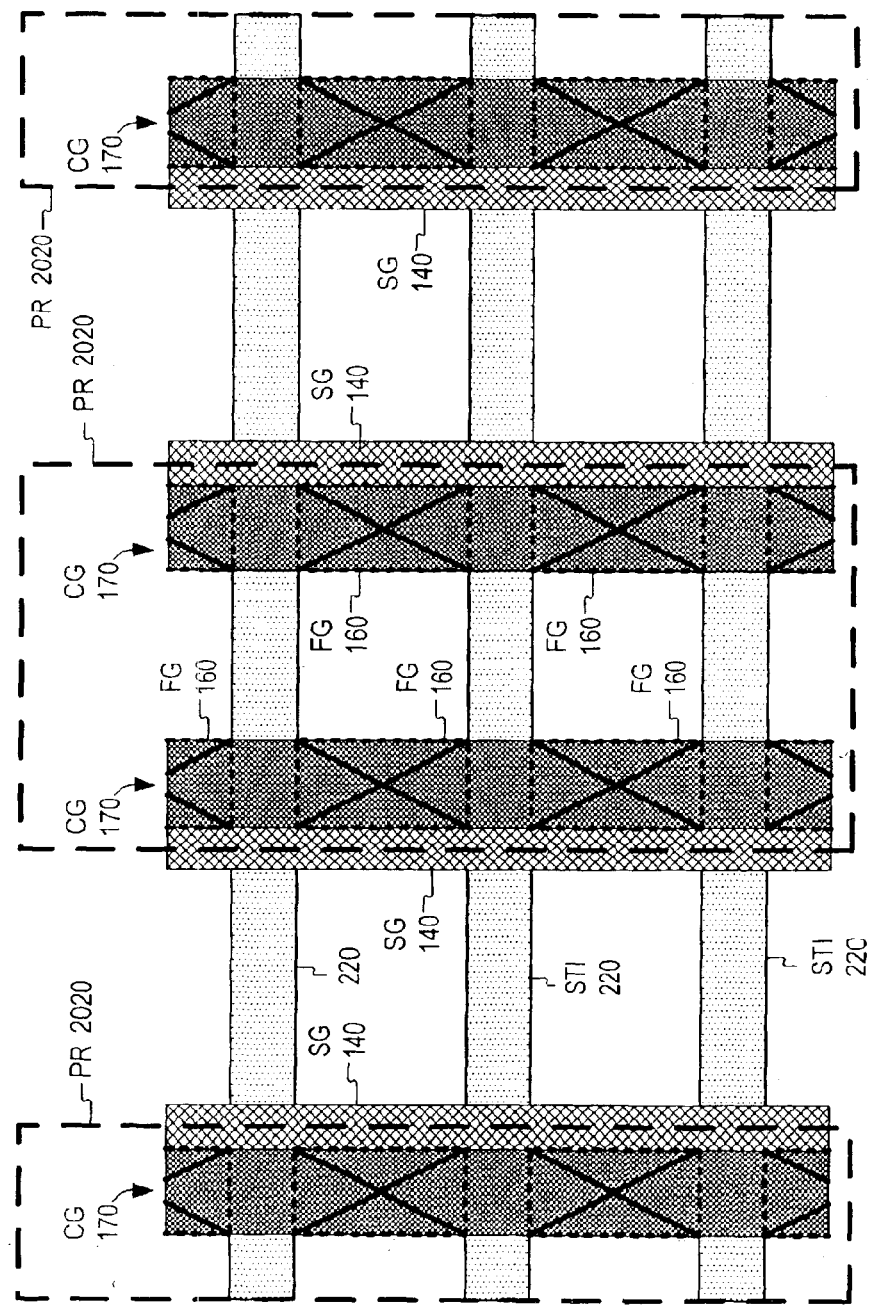
FIG. 20B is a top view of the structure of FIG. 20A.

The wafer is coated with a photoresist layer 2020. The resist is patterned to protect the portion of oxide 1910 on one side of each select gate line 140. FIG. 20B (top view) illustrates the position of mask 2020 with respect to the features shown in FIG. 2. Resist 2020 overlies the future positions of control gate lines 170, and exposes those areas between the adjacent select gate lines 140 in which the control gate polysilicon 170 will be removed. The longitudinal edges of mask 2020 can be located anywhere over the select gate lines 140. The precise mask alignment is therefore not critical in the array area.

Resist 2020 does not cover the peripheral area 1512.

ARC 2010 and oxide 1910 are etched away where exposed by resist 2020. Resist 2020 and the remaining portions of ARC 2010 are then removed. The resulting memory array structure is shown in FIG. 21 (cross section X–X').

The periphery is protected by nitride 1710, and remains as in FIG. 17B.

Nitride 1710 is removed(by a wet etch for example) selectively to oxide 1910. The resulting structure is shown in FIGS. 22A (cross section X–X') and 22B (periphery).

Then the wafer is coated with a photoresist layer (not shown). The resist is patterned to cover the peripheral area. The resist does not cover the memory array. Polysilicon 170 is etched in the array area with oxide 1910 as a mask. The etch is selective to silicon nitride, so the etch stops on ONO 1510. The resulting structure is shown in FIG. 23 (cross section X–X').

ONO 1510 and polysilicon 160 are etched with oxide 1910 as a mask in the array area. Layers 1510, 160 are completely removed from the areas not covered by oxide 1910. See FIG. 24 (cross section X–X'). Oxide 1910 and nitride layers 810, 1030 can be partially removed during the etch of ONO 1510. Floating gates 160 and control gate lines 170 are fully defined at the conclusion of this step, and are as in FIGS. 2 and 3. The width of the top surface of control gate line 170 is W2, defined as described above in connection with FIG. 19.

The memory of FIG. 24 has a reliable sidewall insulation between select gate 140 on the one hand, and the floating gate 160 and the control gate 170 on the other hand. The insulation is provided by layers 1010, 1030. In this respect, the structure of FIG. 24 favorably compares with the memory described in the aforementioned article by Naruke et al. In the Naruke et al. memory, the floating and control gates are formed first in a stacked configuration. Then the select gate is formed as a sidewall spacer. forming a good sidewall insulation on the stack of the floating and control gates is problematic because the floating and control gate layers may have "shoulders" protruding out of the stack. The sidewall insulation can get thinned on the shoulders. Good sidewall insulation is easier to form on the sidewall of the select gate 140 of FIG. 24 because the select gate is not stacked together with any other conductive layers. The invention is not limited to the embodiment of FIG. 24 however, or to the embodiments in which the select gate is not stacked with other conductive layers.

Other advantages of forming the select gate before forming stacked floating and control gates are as follows. If the stack of the floating and control gates is formed first, the etch of the floating and control gate layers may damage the active areas in substrate 120 (if the floating and control gates are made of polysilicon, for example). The active area damage may impede formation of select gate dielectric 130.

Also, in some embodiments, the select gate dielectric 130 is a thermally grown layer of silicon dioxide. If the floating and control gates are formed first, the thermal oxidation that forms the oxide 130 may undesirably oxidize the edges of the floating and control gates. Further, in some embodiments, oxide 130 is thicker than floating gate dielectric 150, and therefore it is desirable to form the oxide 130 early in the fabrication process.

After the etch of polysilicon 160, the resist protecting the peripheral area is removed. The peripheral area remains as in FIG. 22B. Polysilicon 170 is exposed and available for doping in the periphery. The NMOS transistor gates can be doped type N, and the PMOS transistor gates can be doped type P, during the source/drain implants as described below.

The wafer is coated with a photoresist layer 2502 (FIG. 25). The resist is patterned to define the peripheral transistor gates. Resist 2502 covers the memory array. Exposed polysilicon 170 is etched away. Resist 2502 is removed.

Figure 26C:
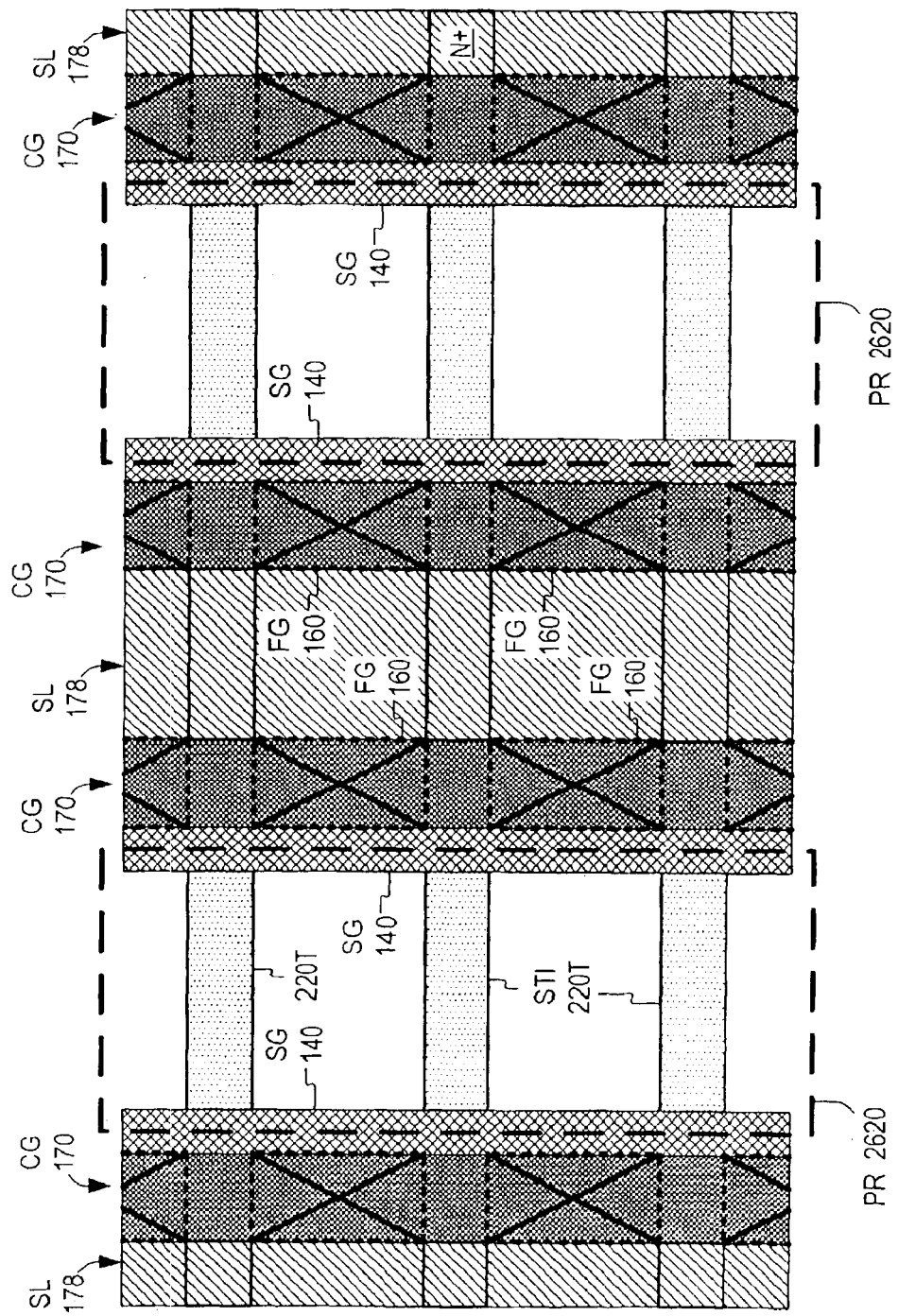
FIG. 26C is a top view of the structure of FIG. 26A.

The wafer is coated with photoresist 2620. The resist is patterned to expose the source lines 178 (FIG. 26A, cross section X–X', and FIG. 26B, top view of the array without the dielectric layers). Each source line 178 traverses the memory array between two adjacent control gate lines 170, and provides one source/drain region to each cell in the two rows associated with the two control gate lines.

The alignment of mask 2620 is not critical because the left and right edges of the mask openings can be positioned anywhere over the respective select gate lines 140 or control gate lines 170.

Resist 2620 covers the peripheral area.

Silicon dioxide 220 is etched out of trenches 220T in the areas exposed by mask 2620, i.e. the areas of source lines 178. This etch removes oxide 1910 and also removes oxide 150 in the active areas over the source lines. Then the source line implant (N+) is performed using the same mask. In some embodiments, this is a high energy, high dose implant, possibly preceded by a lower energy, low dose, large angled implant (the angle can be 10° to 30° for example), to achieve a 0.1 μm to 0.2 μm source line diffusion depth.

In an alternative embodiment, mask 2620 is formed, then a high energy N+ implant is performed before etching out the oxide 220, then the oxide 220 is etched out of the trenches using the same mask, and then another, lower energy N type implant is performed using the same mask. The first (high energy) implant is at least partially blocked by oxide 220 in the trenches to avoid shorting the source lines 178 to N type isolation region 604 (FIG. 6). See the aforementioned U.S. Pat. No. 6,355,524.

Figure 27:
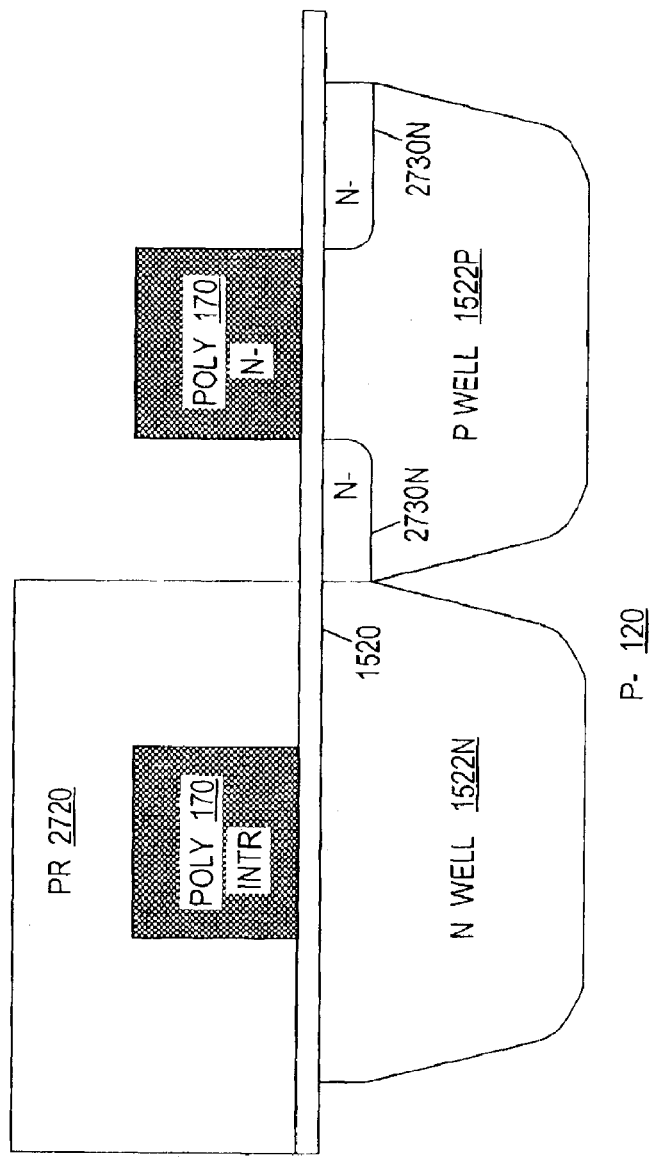

Resist 2620 is removed. The wafer is coated with a photoresist layer 2720 (FIG. 27). The resist is patterned to expose the entire array area and also to expose the peripheral NMOS transistor regions. FIG. 27 shows a peripheral NMOS transistor region 1512N with a P well 1522P, and a peripheral PMOS transistor region 1512P with an N well 1522N. Wells 1522N, 1522P are two of the wells 1522 generally shown in FIG. 15. There can be many regions 1512N, 1512P in the integrated circuit. Resist 2720 covers the PMOS transistor regions 1512P. An N type implant (N−) is performed to form the LDD (lightly doped drain) extensions for NMOS source/drain regions 2730N. This implant also dopes the gates of the peripheral NMOS transistors. Resist 2720 may or may not cover the memory array. If the resist 2720 does not cover the array, the implant provides additional doping for the source lines 178 and also dopes bitline regions 174 (FIG. 29A).

Figure 28:
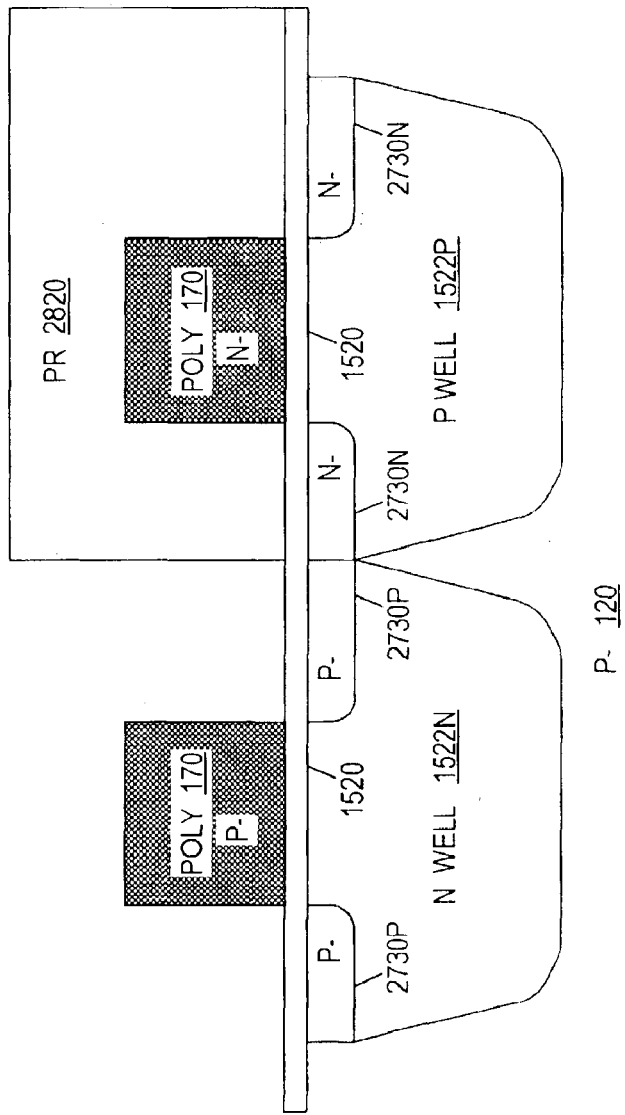

Resist 2720 is removed, and another photoresist layer 2820 (FIG. 28) is formed on the wafer. Resist 2820 is patterned to cover the NMOS peripheral transistor regions 1512N and the array area. A P type implant (P−) is performed to form the LDD extensions for PMOS source/drain regions 2730P and dope the gates of the peripheral PMOS transistors.

Resist 2820 is removed. A thin silicon dioxide layer 2904 (FIG. 29A, cross section X–X', and FIG. 29B, peripheral area) is deposited over the structure by any suitable technique (e.g. TEOS, HTO, RTO). An exemplary thickness of oxide 2904 on the silicon surfaces of substrate 120 and layer 170 is 200 Å to 300Å. If oxide 2904 is deposited thermally (e.g. by RTO, rapid thermal oxidation), the oxide will be much thinner on the silicon nitride surfaces.

Figure 29B:
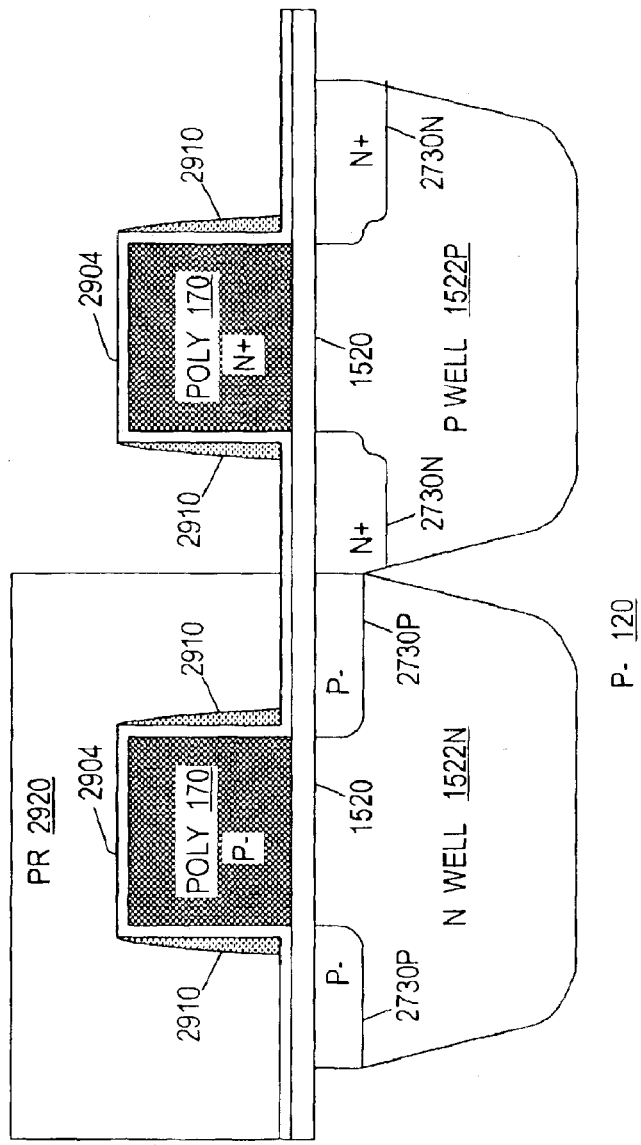
Figure 29C:
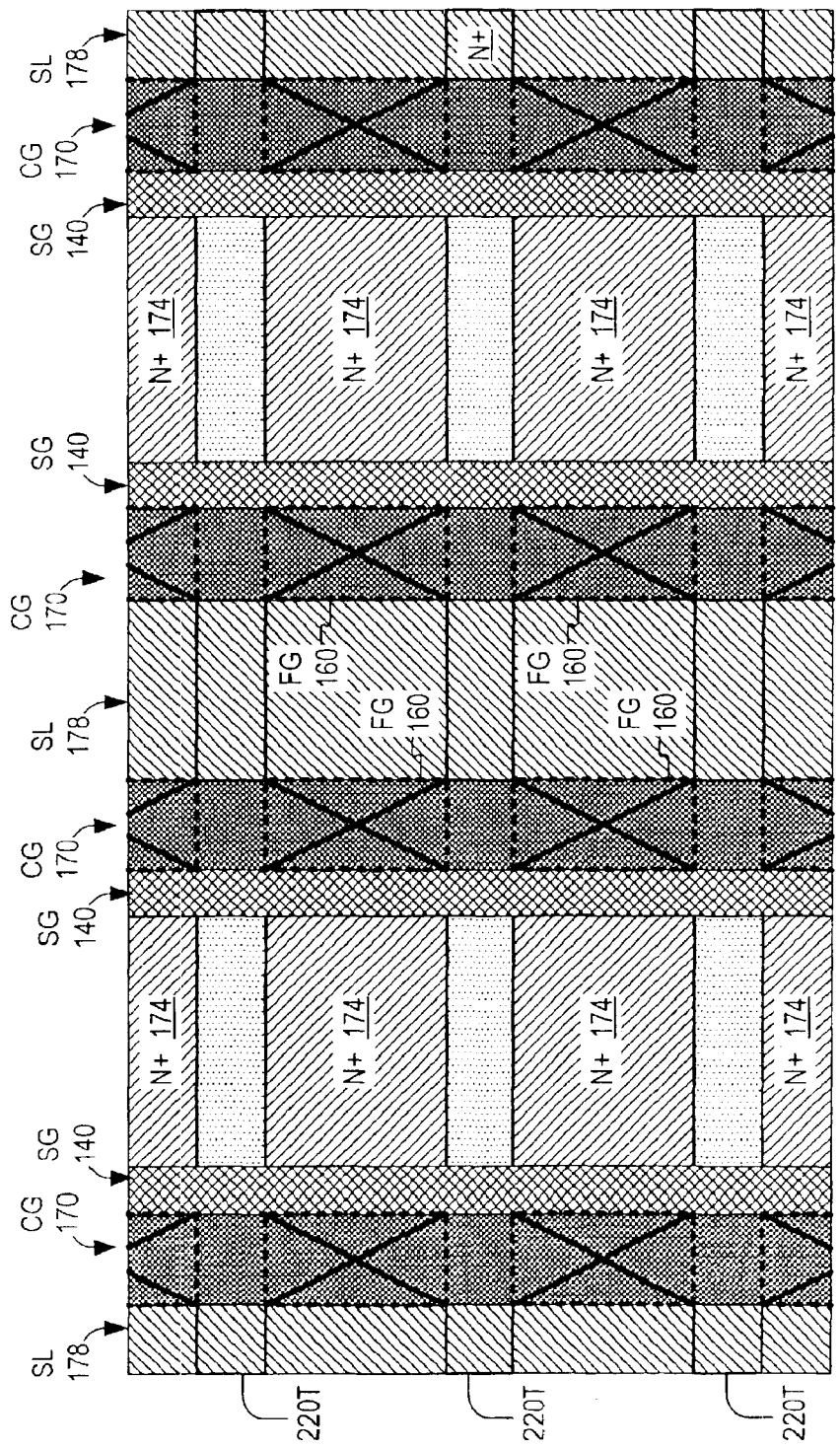
FIG. 29C is a top view of the structure of FIG. 29A.

A thin silicon nitride layer 2910 is deposited and etched anisotropically without a mask to form sidewall spacers on the gates of the peripheral transistors. Spacers 2910 also form in the memory array. Oxide 2904 serves as an etch stop protecting the substrate 120 and the top surfaces of peripheral polysilicon gates 170. The wafer is coated with a photoresist layer 2920 (FIG. 29B). The resist is patterned to cover the PMOS peripheral regions 1512P but expose the NMOS peripheral regions 1512N and the memory array. An N+ implant is performed to create LDD structures for the peripheral NMOS transistors, increase the dopant concentration in the peripheral NMOS transistor gates and in source line regions 178, and to dope bitline regions 174. FIG. 29C is a top view of the resulting memory array structure. The floating, control and select gates and the overlying nitride layers mask this implant so no additional masking in the array area is needed.

Figure 30:
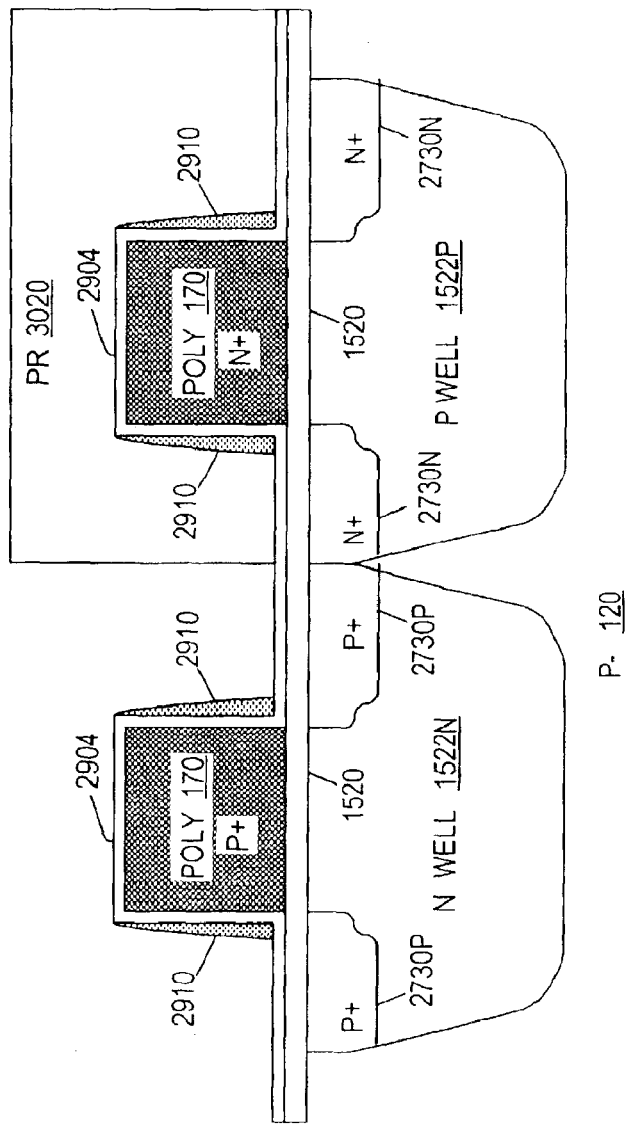
FIGS. 30, 31 show cross sections of the memory of FIG. 2 in the process of fabrication.

Resist 2920 is removed. The wafer is coated with a photoresist layer 3020 (FIG. 30). The resist is patterned to cover the NMOS peripheral regions 1512N and the memory array but to expose the PMOS peripheral regions 1512P. A P+ implant is performed to form the LDD structures for the PMOS transistors and to increase the dopant concentration in the PMOS transistor gates.

Figure 31:
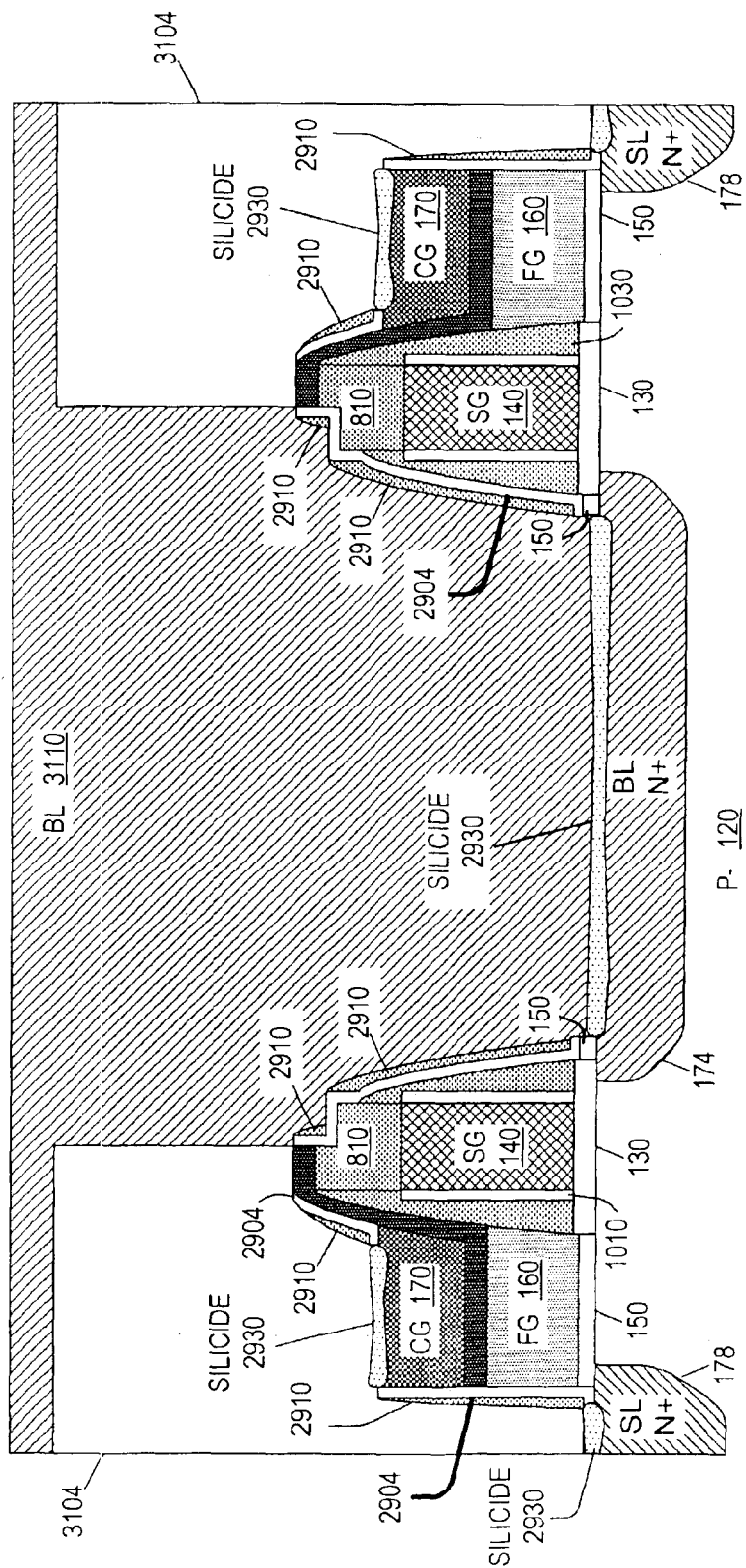

The memory fabrication can be completed using known techniques. In the example of FIG. 31, a blanket silicon dioxide etch removes oxide 2904, 150 from over control gate lines 170, source lines 178, bitline regions 174, and the peripheral transistor gates and source/drain regions (not shown in FIG. 170). A conductive metal silicide layer 2930 is formed on the exposed silicon regions by self-aligned silicidation (salicide). Inter-level dielectric 3104 is deposited over the wafer. Contact openings are etched in dielectric 3104 to expose the silicide 2930 over control gate lines 170, source lines 178, bitline regions 174, and the peripheral gates and source/drain regions. (Only an opening to a bitline region 174 is shown in FIG. 31.) A conductive layer 3110 is deposited and patterned to form the bitlines and other features. The bitlines contact the bitline regions 174. If dielectric 3104 is silicon oxide, the alignment of the mask (not shown) defining the contact openings in layer 3104 is not critical in the memory array area because the select gates 140 are protected by nitride layers 2910, 1030.

Figure 32:
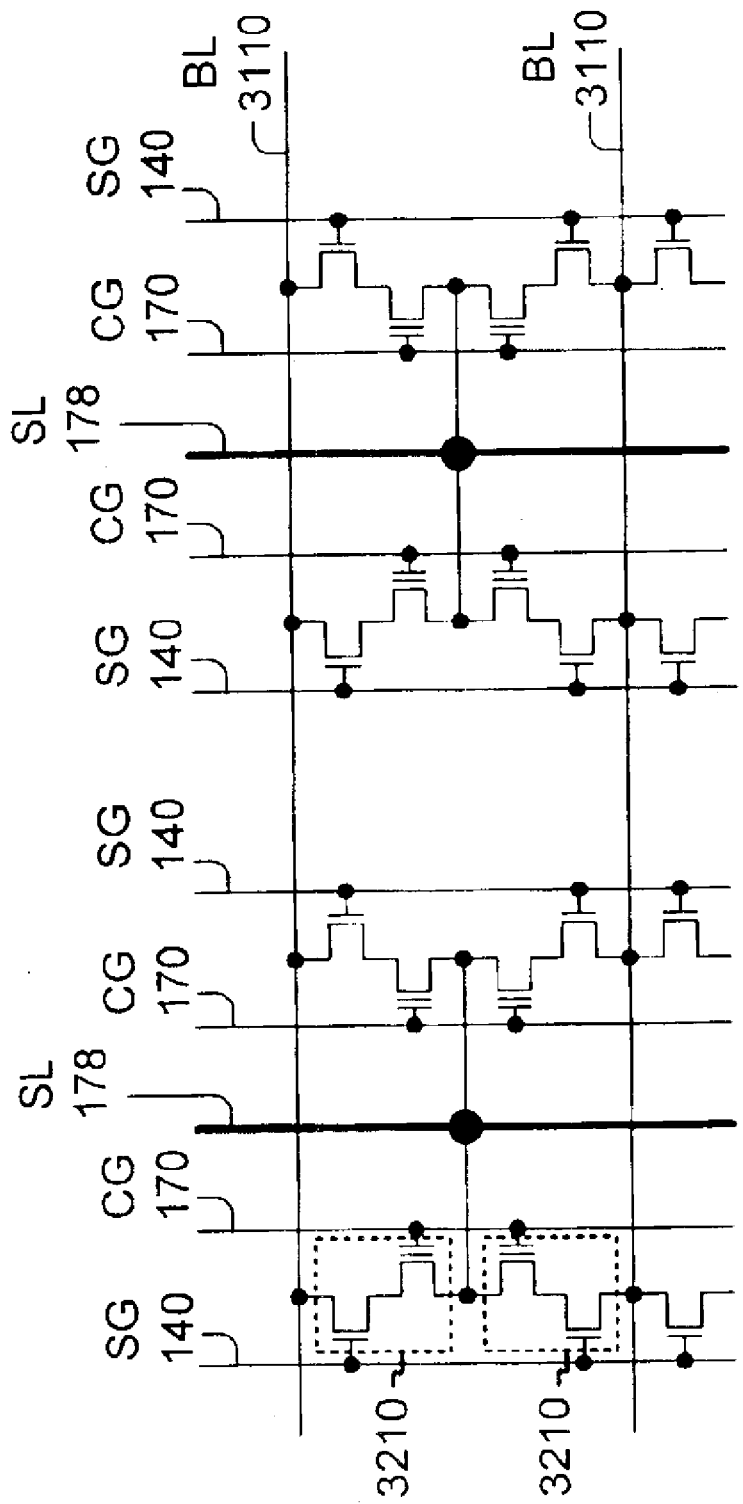
FIG. 32 is a circuit diagram of the memory of FIG. 2.

FIG. 32 is a circuit diagram of one embodiment of the array. This is a NOR array, of the type described in the aforementioned U.S. Pat. No. 6,355,524. Each bitline 3110 is shared by two columns of the memory cells 3210. A cell 3210 is programmed by hot electron injection from the cell's channel region (the P type region in substrate 120 below the cell's floating and select gates) to floating gate 160. The cell is erased by Fowler-Nordheim tunneling of electrons from floating gate 160 to source line region 178 or the channel region.

Figure 33:
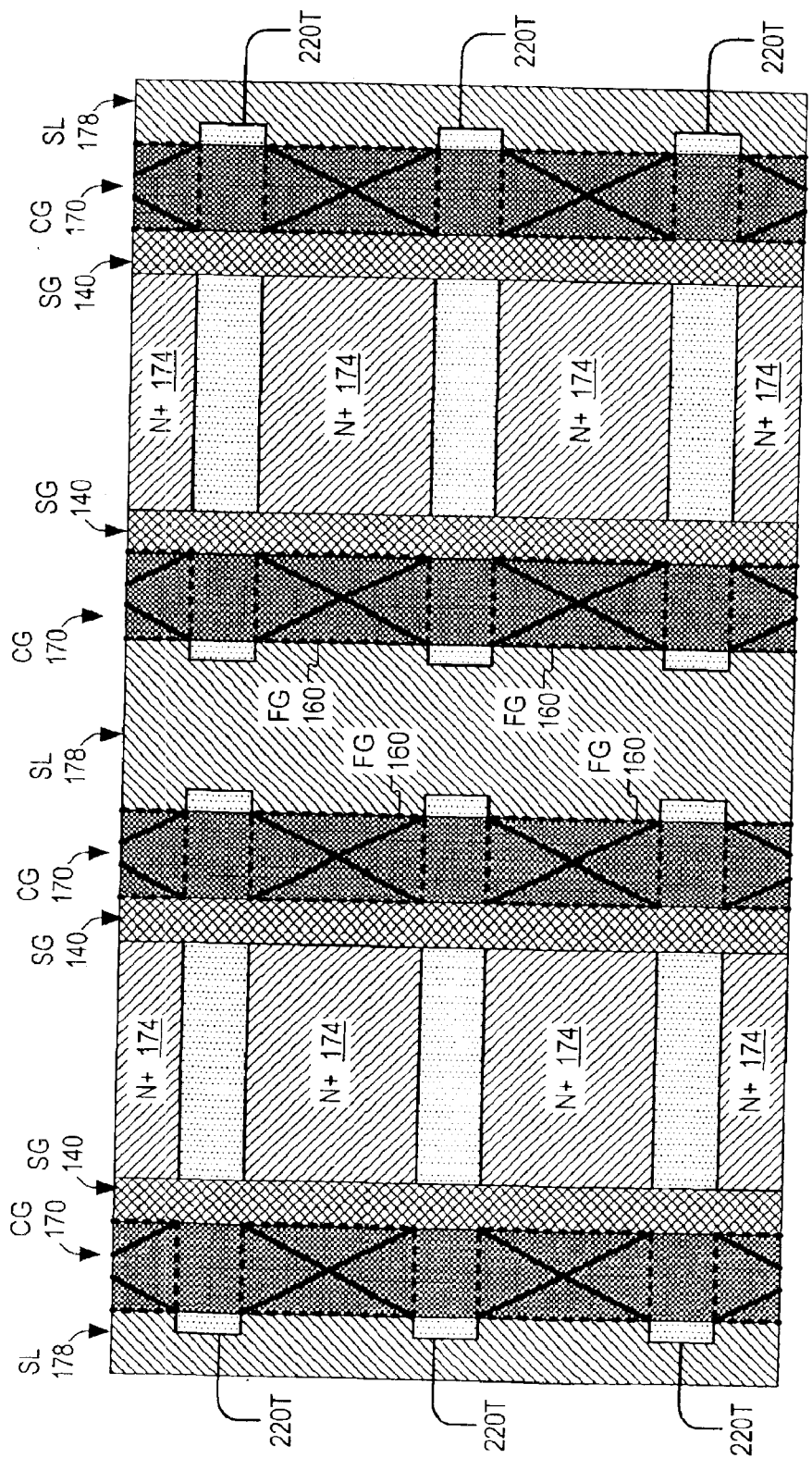
FIG. 33 is a top view of a memory array according to one embodiment of the present invention.

The invention is not limited to such erase or programming techniques or to NOR memory arrays. The invention is not limited to the array architectures described above. For example, the source lines can be formed from a layer overlying the substrate 120 and contacting the source line substrate regions 178; the source lines do not have to go through the isolation trenches. Also, substrate isolation regions 220 do not have to traverse the entire array. In FIG. 33, the substrate isolation regions are interrupted at source lines 178. Dielectric 220 does not have to be etched out of the trenches before the source lines are doped. Shallow trench isolation can be formed by other techniques, and can be replaced with LOCOS or other isolation types, known or to be invented. See e.g. U.S. Pat. No. 6,355,524 issued Mar. 12, 2002 to Tuan et al.; U.S. patent application Ser. No. 10/262,785 filed Oct. 1, 2002 by Yi Ding; and U.S. patent application Ser. No. 10/266,378 filed Oct. 7, 2002 by C. Hsiao, all incorporated herein by reference. The invention is applicable to multi-level cell memories (the memories in which the cell may contain multiple bits of information). The invention is not limited to any particular processing steps, materials, or other particulars described above. The invention is not limited to LDD or other peripheral structures. Other embodiments and variations are within the scope of the invention, as defined by the appended claims.

What is claimed is:

1. A method for fabricating an integrated circuit which comprises a nonvolatile memory cell comprising a first conductive gate, a second conductive gate, and a conductive floating gate which are insulated from each other, the method comprising:

(a) forming the first conductive gate over a semiconductor substrate, and forming a dielectric over a sidewall of the first conductive gate to insulate the first conductive gate from the floating gate;

(b) forming an FG layer over the first conductive gate, wherein the floating gate comprises a portion of the FG layer;

(c) removing the FG layer from over at least a portion of the first conductive gate;

(d) forming a second conductive gate layer over the FG layer to provide at least a portion of the second conductive gate, the second conductive gate layer having a portion P1 protruding above the first conductive gate;

(e) forming a first layer L1 over the second conductive gate layer such that the protruding portion P1 is exposed and not completely covered by the first layer L1;

(f) partially removing the second conductive gate layer at the location of the portion P1 selectively to the first layer L1 to remove the second conductive gate layer from over at least a portion of the first conductive gate;

(g) forming a second layer L2 on the second conductive gate layer adjacent to the first conductive gate; and (h) removing at least parts of the first layer L1, the second conductive gate layer and the FG layer selectively to the second layer L2.

2. The method of claim 1 wherein the operation (g) comprises reacting the second conductive gate layer with another material to form the second layer L2.

3. The method of claim 2 wherein the reacting operation comprises oxidation of the second conductive gate layer.

4. The method of claim 2 wherein the reacting operation comprises a chemical reaction of the second conductive gate layer with a metal, and the chemical reaction is followed by removal of non-reacted metal.

5. The method of claim 1 further comprising removing the first layer L1, the second conductive layer and the FG layer on a first side of the first conductive gate but not a second side of the first conductive, gate, the second side being opposite to the first side.

6. The method of claim 5 further comprising forming a first source/drain region for the memory cell in the semiconductor substrate adjacent to the floating gate on the second side of the first conductive gate, and forming a second source/drain region for the memory cell in the semiconductor substrate adjacent to the first conductive gate on the first side of the first conductive gate.

7. The method of claim 1 wherein the memory cell is part of an array of memory cells each of which comprises a first conductive gate, a second conductive gate, and a floating gate that are insulated from each other;

wherein the operation (a) comprises forming one or more first conductive lines each of which provides at least a portion of each of a plurality of the first conductive gates;

wherein each floating gate comprises at least a portion of the FG layer;

wherein the operation (c) removes the FG layer from over at least a portion of each first conductive gate;

wherein the second conductive gate layer provides at least a portion of each second conductive gate;

wherein at a conclusion of the operation (d) the second conductive gate layer comprises a portion protruding above each first conductive gate;

wherein at a conclusion, of the operation (e) the second conductive gate layer is exposed over each first conductive gate;

wherein the operation (f) partially removes the second conductive gate layer from over at least a portion of each first conductive gate;

wherein the operation (g) forms the second layer L2 on the second conductive gate layer adjacent to each first conductive gate.

* * * * *